United States Patent
Ivanov et al.

(10) Patent No.: US 8,586,133 B2
(45) Date of Patent: Nov. 19, 2013

(54) METHOD FOR STRENGTHENING ADHESION BETWEEN DIELECTRIC LAYERS FORMED ADJACENT TO METAL LAYERS

(75) Inventors: Igor C. Ivanov, Dublin, CA (US);
Weiguo Zhang, San Jose, CA (US);
Artur Kolics, Dublin, CA (US)

(73) Assignee: Lam Research Corporation, Fremont, CA (US)

( * ) Notice: Subject to any disclaimer, the term of this patent is extended or adjusted under 35 U.S.C. 154(b) by 0 days.

(21) Appl. No.: 13/540,036

(22) Filed: Jul. 2, 2012

(65) Prior Publication Data

US 2012/0282483 A1    Nov. 8, 2012

Related U.S. Application Data

(62) Division of application No. 12/889,688, filed on Sep. 24, 2010, now abandoned, which is a division of application No. 10/462,343, filed on Jun. 16, 2003, now Pat. No. 7,883,739.

(51) Int. Cl.
*C23C 20/02* (2006.01)
*C23C 20/04* (2006.01)
*H01L 21/28* (2006.01)
*H01L 21/288* (2006.01)

(52) U.S. Cl.
USPC ......... 427/97.6; 427/304; 427/305; 427/96.1; 427/97.1; 427/97.2; 427/98.2; 427/98.3; 427/372.2; 427/383.1; 438/643; 438/653; 438/660; 438/667; 257/E21.584; 257/E21.585

(58) Field of Classification Search
None
See application file for complete search history.

(56) References Cited

U.S. PATENT DOCUMENTS 5,674,787 A    10/1997    Zhao et al.
5,695,810 A    12/1997    Dubin et al.
(Continued)

FOREIGN PATENT DOCUMENTS

EP    1022770    7/2000
EP    1312696    5/2003
(Continued)

OTHER PUBLICATIONS

International Search Report & Written Opinion, PCT/US2004/019349, mailed May 10, 2005.

(Continued)

*Primary Examiner* — Michael Cleveland
*Assistant Examiner* — Lisha Jiang
(74) *Attorney, Agent, or Firm* — Mollie E. Lettang; Daffer McDaniel LLP

(57) ABSTRACT

A method is provided which includes forming a metal layer and converting at least a portion of the metal layer to a hydrated metal oxide layer. Another method is provided which includes selectively depositing a dielectric layer upon another dielectric layer and selectively depositing a metal layer adjacent to the dielectric layer. Consequently, a microelectronic topography is formed which includes a metal feature and an adjacent dielectric portion comprising lower and upper layers of hydrophilic and hydrophobic material, respectively. A topography including a metal feature having a single layer with at least four elements lining a lower surface and sidewalls of the metal feature is also provided herein. The fluid/s used to form such a single layer may be analyzed by test equipment configured to measure the concentration of all four elements. In some cases, the composition of the fluid/s may be adjusted based upon the analysis.

16 Claims, 12 Drawing Sheets

(56) References Cited

U.S. PATENT DOCUMENTS

| | | | |
|---|---|---|---|
| 5,798,903 | A | 8/1998 | Dhote et al. |
| 5,830,805 | A | 11/1998 | Shacham-Diamand et al. |
| 5,843,843 | A | 12/1998 | Lee et al. |
| 5,942,799 | A | 8/1999 | Danek et al. |
| 5,976,928 | A | 11/1999 | Kirlin et al. |
| 6,017,437 | A | 1/2000 | Ting et al. |
| 6,037,664 | A | 3/2000 | Zhao et al. |
| 6,144,099 | A | 11/2000 | Lopatin et al. |
| 6,174,647 | B1 | 1/2001 | Cahalen et al. |
| 6,214,728 | B1 | 4/2001 | Chan et al. |
| 6,267,853 | B1 | 7/2001 | Dordi et al. |
| 6,286,525 | B1 | 9/2001 | Nishimura et al. |
| 6,296,753 | B1 | 10/2001 | Kaufman et al. |
| 6,323,128 | B1 | 11/2001 | Sambucetti et al. |
| 6,326,287 | B1 | 12/2001 | Asahina et al. |
| 6,417,118 | B1 | 7/2002 | Hu et al. |
| 6,423,144 | B1 | 7/2002 | Watanabe |
| 6,440,844 | B1 | 8/2002 | Takagi et al. |
| 6,447,933 | B1 | 9/2002 | Wang et al. |
| 6,479,902 | B1 | 11/2002 | Lopatin et al. |
| 6,486,055 | B1 | 11/2002 | Jung et al. |
| 6,498,714 | B1 | 12/2002 | Fujisawa et al. |
| 6,528,409 | B1 | 3/2003 | Lopatin et al. |
| 6,531,386 | B1 | 3/2003 | Lim et al. |
| 6,548,844 | B1 | 4/2003 | Fukuzumi et al. |
| 6,555,158 | B1 * | 4/2003 | Yoshio et al. .......... 438/643 |
| 6,570,325 | B2 | 5/2003 | Graff et al. |
| 6,630,400 | B2 | 10/2003 | Jiang et al. |
| 6,638,564 | B2 | 10/2003 | Segawa et al. |
| 6,645,567 | B2 | 11/2003 | Chebiam et al. |
| 6,677,251 | B1 | 1/2004 | Lu et al. |
| 6,680,540 | B2 | 1/2004 | Nakano et al. |
| 6,696,758 | B2 | 2/2004 | Dubin et al. |
| 6,717,189 | B2 | 4/2004 | Inoue et al. |
| 6,734,559 | B1 | 5/2004 | Yang et al. |
| 6,821,902 | B2 | 11/2004 | Inoue et al. |
| 6,821,909 | B2 | 11/2004 | Ramanathan et al. |
| 6,824,612 | B2 | 11/2004 | Stevens et al. |
| 6,860,944 | B2 | 3/2005 | Ivanov et al. |
| 6,878,632 | B2 | 4/2005 | Nogami et al. |
| 6,881,437 | B2 | 4/2005 | Ivanov et al. |
| 6,913,651 | B2 | 7/2005 | Ivanov et al. |
| 7,279,423 | B2 | 10/2007 | Johnston et al. |
| 7,387,131 | B2 | 6/2008 | Kuroda et al. |
| 2001/0018266 | A1 | 8/2001 | Jiang et al. |
| 2002/0084529 | A1 | 7/2002 | Dubin et al. |
| 2002/0127829 | A1 | 9/2002 | Marumo |
| 2002/0139663 | A1 | 10/2002 | Kosaki et al. |
| 2002/0167086 | A1 | 11/2002 | Stauf et al. |
| 2002/0180043 | A1 | 12/2002 | Asahina et al. |
| 2003/0034251 | A1 | 2/2003 | Chikarmane et al. |
| 2003/0075808 | A1 | 4/2003 | Inoue et al. |
| 2003/0113576 | A1 | 6/2003 | Chebiam et al. |
| 2003/0181040 | A1 | 9/2003 | Ivanov et al. |
| 2004/0097071 | A1 | 5/2004 | Ivanov |
| 2004/0121596 | A1 | 6/2004 | Pan et al. |
| 2004/0216841 | A1 | 11/2004 | Ito et al. |
| 2004/0253814 | A1 | 12/2004 | Cheng et al. |

FOREIGN PATENT DOCUMENTS

| | | |
|---|---|---|
| FR | 2816758 | 5/2002 |
| JP | 2001020091 | 1/2001 |
| WO | 02/092877 | 11/2002 |
| WO | 03/014416 | 2/2003 |

OTHER PUBLICATIONS

Shacham-Diamand et al., "The electrical and material properties of MOS capacitors with electrolessly deposited integrated copper gate," Microelectronic Engineering, vol. 55, 2001, pp. 313-322.

Shacham-Diamand et al., "Electrochemically deposited thin film alloys for ULSI and MEMS applications," Microelectronic Engineering, vol. 50, 2000, pp. 525-531.

Kohn et al., "Evaluation of electroless deposited Co(W,P) thin films as diffusion barriers for copper metallization," Microelectronic Engineering, vol. 55, 2001, pp. 297-303.

Kohn et al., "Characterization of electroless deposited Co(W,P) thin films for encapsulation of copper metallization," Materials Science and Engineering, vol. A302, 2001, pp. 18-25.

Lee et al., "Electroplated Cu and Sputtered Ta Crystallographic Texture Degradation in Cu/Ta/SiOF Layered Structures," Journal of Electrochemical Society, vol. 148, No. 3, 2001, pp. C131-C135.

Shacham-Diamand et al., "Electroless Deposition of Thin-Film Cobalt-Tungsten-Phosphorus Layers Using Tungsten Phosphoric Acid ($H_3[P(W_3O_{10})_4]$) for ULSI and MEMS Applications," Journal of Electrochemical Society, vol. 148, No. 3, 2001, pp. C162-C167.

Segawa et al., "Manufacturing-ready Selectivity of CoWP Capping on Damascene Copper Interconnects," Advanced Metallization Conference, 2001, 6 pages.

Lopatin et al., "Selective Electroless CoWP Deposition onto Pd-Activated In-Laid Cu Lines," VMIC Conference, 1997, pp. 219-224.

O'Sullivan et al., "Electrolessly deposited diffusion barriers for microelectronics," IBM Journal of Research and Development, vol. 42, No. 5, 1998, 20 pages.

Shacham-Diamand et al., "Integrated electroless metallization for ULSI," Electrochimica Acta, vol. 44, 1999, pp. 3639-3649.

Shacham-Diamand et al., "Electroless Co(Mo,P) films for Cu interconnect application," Microelectronic Engineering, vol. 64, 2002, pp. 315-320.

Hu et al., "Reduced electromigration of Cu wires by surface coating," Applied Physics Letters, vol. 81, No. 10, Sep. 2002, pp. 1782-1784.

Patent Abstracts of Japan, Publication No. 2004134667, published Apr. 30, 2004.

Hu et al., "Reduced Cu interface diffusion by CoWP surface coating," Microelectronic Engineering, vol. 70, 2003, pp. 406-411.

Office Action mailed Jun. 5, 2006 for U.S. Appl. No. 10/462,343.

Final Office Action mailed Nov. 6, 2006 for U.S. Appl. No. 10/462,343.

Office Action mailed Jun. 6, 2007 for U.S. Appl. No. 10/462,343.

Final Office Action mailed Nov. 7, 2007 for U.S. Appl. No. 10/462,343.

Office Action mailed May 30, 2008 for U.S. Appl. No. 10/462,343.

Final Office Action mailed Dec. 12, 2008 for U.S. Appl. No. 10/462,343.

Examiner's Answer mailed Jul. 30, 2009 for U.S. Appl. No. 10/462,343.

BPAI Decision of Appeal mailed Apr. 15, 2010 for U.S. Appl. No. 10/462,343.

Notice of Allowance mailed Jun. 22, 2010 for U.S. Appl. No. 10/462,343.

* cited by examiner

METHOD FOR STRENGTHENING ADHESION BETWEEN DIELECTRIC LAYERS FORMED ADJACENT TO METAL LAYERS

CONTINUING DATA

The present application is a divisional from U.S. patent application Ser. No. 12/889,688 filed Sep. 24, 2010 (now abandoned) which is a divisional from U.S. patent application Ser. No. 10/462,343 filed Jun. 16, 2003 (now U.S. Pat. No. 7,883,739).

BACKGROUND OF THE INVENTION

1. Field of the Invention

This invention generally relates to microelectronic processing, and more particularly to the formation and processing of diffusion barrier layers.

2. Description of the Related Art

The following descriptions and examples are not admitted to be prior art by virtue of their inclusion within this section.

Electroless plating is a process for depositing materials on a catalytic surface from an electrolyte solution without an external source of current. An advantage of an electroless deposition process is that it can be selective, i.e., the material can be deposited only onto areas that demonstrate appropriate chemical properties. In particular, local deposition can be performed onto metals that exhibit an affinity to the material being deposited or onto areas pretreated or pre-activated, e.g., with a catalyst. The material or catalyst applied onto the selected areas is sometimes called a "seed material" or "seed layer" and the ratio of the deposition rate on the activated regions to the deposition rate at the non-activated regions is known as the "deposition process selectivity." For many applications, it is important to provide a deposition of high selectivity. Other important characteristics of an electroless deposition process are uniform thickness and adherence of the deposited layer to the substrate.

Most conventional electroless deposition processes include a series of solution baths. Such a series of baths are used for preparing a surface for the electroless deposition process, as well as the processes including and subsequent to the deposition process. Such a process configuration, however, facilitates the deposition of foreign particles and/or contaminants on a substrate surface when transferring the substrates from bath to bath. Another common problem with treating a surface in a series of baths is the exposure of the substrate surface to air during the transfer between baths. Such an exposure to air may cause oxidation of the substrate surface that will result in poor catalytic activity and poor quality metal deposits. This problem becomes especially troublesome when using materials that easily oxidize in air, such as copper. In an attempt to overcome these problems, some equipment manufacturers have proposed apparatuses which process a substrate in one chamber for a plurality of different process steps associated with an electroless deposition process.

Such apparatuses, however, fail to prevent the solutions from the plurality of different process steps from mixing once they are expelled from the process chamber. Consequently, the apparatuses may not reuse process solutions within the apparatus, incurring higher material costs and waste disposal costs for the electroless deposition process. In addition, such apparatuses fail to provide a manner with which to supply air exterior to the process chamber during processing, such as for a drying step, for example. In particular, prior art apparatuses may only offer two modes of operation, one in which the chamber is sealed for processing and another in which the chamber is not sealed for loading. In other cases, prior art apparatuses may not be sealed at all. In any embodiment, another problem with conventional process chambers is the manner in which a substrate is secured within the process chamber. In particular, few conventional process chambers offer a manner with which to secure a substrate without causing damage to the substrate, particularly along the edges of the substrate.

One common drawback of existing electroless deposition processes and apparatuses is low speed of deposition. For example, a typical electroless deposition process does not generally exceed 100 nm/min. The deposition rate of an electroless process may generally depend on the material to be deposited and, therefore, the deposition rate may be much lower than 100 nm/min, in some cases. For example, the speed of deposition of a cobalt-tungsten-phosphorus layer may be within between approximately 0.01 nm/min and approximately 10 nm/min. In general, the deposition rate of an electroless process may depend on characteristics of the activated areas, such as dimensions, profiles of the exposed surfaces, and distances between the portions of the areas to be activated. In some embodiments, the deposition rate of an electroless process may further depend on the temperature of the solution used to deposit the material. In particular, the deposition rate may increase with increases in temperature. However, many electroless deposition solutions tend to decompose at high temperatures, leading to significant non-uniformities in the deposited material. On the other hand, deposition rates of electroless solutions at relatively low temperatures may be undesirably low, reducing production throughput and increasing fabrication costs.

Another common problem with electroless deposition processes is the formation of gas bubbles on the substrate surface during processing. In general, the formation of gas bubbles may be due to the evolution of hydrogen during the reduction-oxidation process of the electroless deposition process and/or by a high level of hydrophobicity within the substrate of the wafer. The gas bubbles undesirably prevent a material from being deposited uniformly upon a substrate surface, potentially depositing a layer outside the specifications of the process.

In some embodiments, electroless deposition may be used for the formation of metal features within integrated circuits. In fact, electroless deposition techniques may be particularly advantageous for forming copper features within a microelectronic topography, which well matches the present trend for using copper as interconnect materials instead of aluminum, tungsten, silicides, or the like. In addition, electroless deposition techniques are favorable for depositing materials into deep holes within the topography that cannot be uniformly covered by other deposition techniques, such as sputtering and evaporation, for example. As such, an electroless deposition process may be advantageous for depositing a metal material using a dual damascene process.

In some microelectronic devices, a trench comprising a metal feature may also include a liner layer and a cap layer to prevent the diffusion of the bulk metal layer within the metal feature to underlying and overlying layers of the topography, respectively. In some cases, however, it may be difficult to clean and activate the barrier layer for a sufficient deposition of a bulk metal layer. In particular, the barrier layer may be cleaned and activated for the deposition of the bulk metal layer, but it may be difficult to prevent the surface from being contaminated between processes. In addition or alternatively, it may be difficult to selectively deposit or align a cap layer upon the bulk metal layer such that no other metal adheres to the dielectric portions of the topography arranged adjacent to the metal feature. In embodiments in which a bulk metal layer is polished to be confined within the sidewalls of a trench, the dielectric portion of the topography arranged adjacent to the metal feature may include small fragments of the bulk metal layer upon its upper surface. The small fragments may be catalytic to the electroless deposition of the cap layer or may attract a catalytic seed layer used to electrolessly deposit the cap layer. In either case, portions of the cap layer may be undesirably deposited upon the dielectric portion, potentially causing a short within the circuit.

As such, it would be advantageous to develop a system and methods for processing a microelectronic topography, particularly for processes associated with an electroless deposition process. For example, it would be desirable to develop a system which is configured to conduct one or more process steps within a chamber without taking a microelectronic topography arranged therein out between steps. In addition, it would be beneficial to have a system which prevents process solutions from mixing upon being dispensed from the process chamber. Such a process chamber may be further adapted to secure a wafer within the chamber as well as have a means to provide an air passage to the chamber during processing. In some cases, the process chamber may be additionally or alternatively adapted to prevent the generation and accumulation of bubbles upon a wafer surface during processing. In addition, the process chamber may be configured to offer a manner with which to increase the boiling point of an electroless deposition solution used within the chamber. Additional benefits may also be realized by methods which offer to provide a barrier layer which is not contaminated by particles prior to an electroless deposition process and which is either autocatalytic or is readily available for the deposition of a catalytic seed layer. In addition, it may be advantageous to develop a method which prevents the deposition of a cap layer upon dielectric portions of a topography.

SUMMARY OF THE INVENTION

The problems outlined above may be in large part addressed by improved systems and methods for processing a microelectronic topography. In some embodiments, the systems and method may be specifically used for processes prior to, during, and subsequent to an electroless deposition process. However, the system and methods described herein are not necessarily restricted to such processes. In general, a system is provided which is adapted to conduct one or more processes within a process chamber. In some embodiments, the system may be adapted to conduct a succession of processes without having the microelectronic topography removed from the process chamber. Alternatively, however, the system may be used to conduct a single process. In either case, the system described herein may include a process chamber having a plurality of auxiliary equipment arranged therein and coupled thereto. For example, the system may include a plurality of supply lines, storage tanks, process control devices, and temperature and pressure gauges. In addition, the process chamber may include a substrate holder, a plurality of inlets and outlets, a loading port, and a plurality of other components, such as a gate, for example. It is noted that the plurality of components and methods provided herein are not co-dependent and, therefore, may not necessarily be employed together. In particular, the system described herein may be constructed to include any combination of the components described below. In addition, the methods for processing a microelectronic topography, as described herein, may include any one or a plurality of the methods discussed below.

In general, the system described herein may be adapted to form a first enclosed area about and including a substrate holder of a process chamber of the system. In some embodiments, however, the system may be adapted to form another, smaller enclosed area about and including the substrate holder. Such an adaptation to form two different enclosed regions may entail the process chamber to include at least two outer portions configured to couple with each other and form the first enclosed region and at least two inner portions configured to couple with each other and form the second enclosed region. As noted above, in some embodiments, the system may be adapted to perform a succession of different process steps within the process chamber. In such an embodiment, the system may be further adapted to couple the outer portions prior to the succession of the different process steps. In some cases, however, the system may be adapted to uncouple the outer portions for a drying process of the microelectronic topography. Alternatively, the outer portions may not be uncoupled for such a drying process.

In either case, the system may be adapted to couple and uncouple the inner portions between the different process steps without uncoupling the outer portions. For example, in some cases, the system may be adapted to couple the inner portions prior to an electroless deposition process and uncouple the inner portions subsequent to the electroless deposition process. Consequently, the system may be adapted to dispense different processing fluids into the first and second enclosed areas during the different process steps. "Fluids," as used herein, may refer to liquids, gases, or plasmas, including gases in a standard state or an excited state (i.e., a photon-activated gas state). The fluids in any of such states of matter may be used at pressures below, at, or above atmospheric pressure as well as at temperatures associated with the respective process step of the fabrication process. In some embodiments, the process chamber may include a first outlet within one of the outer portions and a second outlet within one of the inner portions. In some cases, the process chamber may be adapted to prevent processing fluids in the first enclosed area from entering the second outlet. For example, the process chamber may include a means for spinning the microelectronic topography. In particular, the process chamber may be adapted to spin the microelectronic topography at a particular rate, such as between approximately 0 rpm and approximately 8000 rpm, or more specifically between approximately 40 rpm and approximately 1200 rpm when the inner portions are uncoupled. In contrast, the microelectronic topography may or may not be spun when the inner portions are coupled.

A method for processing a microelectronic topography using a chamber adapted to form different enclosed regions about a substrate holder is contemplated herein. In particular, the method may include loading the microelectronic topography into a process chamber and closing the process chamber to form a first enclosed area about the microelectronic topography. The formation of the first enclosed area may, in some embodiments, include moving a cover plate toward a base plate of the process chamber. In yet other embodiments, however, the formation of the first enclosed area may include moving the base plate toward the cover plate or moving the cover plate and base plate toward each other. In either case, the method may further include supplying a first set of fluids to the first enclosed area to process the microelectronic topography in one or more process steps. Subsequently, the method may include forming a second, distinct enclosed area about the microelectronic topography and supplying a second set of fluids to the second enclosed area to further process the microelectronic topography in one or more other process steps.

In some cases, the first set of fluids may include fluids for preparing the microelectronic topography for an electroless deposition process, while the second set of fluids may include a deposition solution for the electroless deposition process. In such an embodiment, the method may further include reforming the first enclosed area subsequent to the step of supplying the second set of fluids and supplying a third set of fluids to the reformed first enclosed area to further process the microelectronic topography. Alternatively, the first set of fluids may include a deposition solution for an electroless deposition process, and the second set of fluids may include fluids for processing the microelectronic topography subsequent to the electroless deposition process.

In any case, the method may further include spinning the microelectronic topography. Such a spinning step may be conducted while the first and/or second set of fluids is supplied to the process chamber. In some embodiments, spinning the microelectronic topography may be further conducted during the formation of the first and/or second enclosed areas. In general, the rate at which to spin the topography may depend on the material supplied to the process chamber. In particular, a relatively high spin rate may be needed for fluids with a relatively high viscosity, while a relatively lower spin rate may be needed for fluids with a relatively low viscosity. As such, the spin rate of the topography when the first and second sets of fluids are supplied to the process chamber may be similar or may be substantially different. In any case, the microelectronic topography may generally be spun at a rate between approximately 0 rpm and approximately 8000 rpm, or more specifically between approximately 40 rpm and approximately 1200 rpm, depending on the viscosity of the fluid supplied to the process chamber. In some embodiments, the topography may be rotated at a sufficient rate to prevent fluids from entering a certain outlet as stated above.

As noted above, the process chamber may have a gate attached thereto in some embodiments. As such, a process chamber is provided which includes a wall with an opening and a gate casing arranged adjacent to the wall such that an opening within the gate casing opening is spaced laterally adjacent to the wall opening. In some cases, the gate casing may be arranged such that the gate casing opening is spaced in direct lateral alignment with the wall opening. In such an embodiment, the wall opening and the gate casing opening may include dimensions large enough to allow one or more wafers to be loaded within the process chamber. In yet other embodiments, the openings may not necessarily need to have dimensions that large, particularly when the gate is simply used to provide an air passage to the process chamber as described below. As such, the gate casing may not necessarily be arranged such that the gate casing opening is in direct lateral alignment with the wall opening.

In either case, the process chamber may further include a gate latch configured to align barriers of the gate latch with the wall opening and the gate casing opening. In some embodiments, the gate latch is configured to move within the space between the wall and gate casing. In this manner, the gate latch may be configured to move the barriers such that the barriers are not in alignment with the wall opening and gate casing opening as well. In some cases, the portion of the gate latch comprising the barriers may be configured to move such that the two openings are either sealed or provide an air passage to the process chamber when the barriers are respectively aligned with the two openings. In this manner, the barriers may prevent fluids within the process chamber from flowing through the wall opening and gate casing opening whenever the barriers are respectively aligned with the two openings. In some embodiments, the process chamber may be adapted to draw air through the air passage and into the process chamber.

Consequently, a method for processing a microelectronic topography within a process chamber having such a gate is provided herein. The method may include loading a microelectronic topography into a process chamber. Such a step of loading may include introducing the microelectronic topography through an opening of the process chamber that serves as a loading port of the chamber, which may or may not have the gate arranged adjacent thereto. The method may further include sealing the loading port or another opening within the process chamber with a gate. In some cases, the step of sealing may include moving the gate such that barriers of the gate are in alignment with the opening of the process chamber. Alternatively, the gate may be fixed adjacent to the opening. In either case, the method may further include exposing the microelectronic topography to a first set of process steps. In some embodiments, the first set of process steps may include electrolessly depositing a layer upon the microelectronic topography as well as process steps conducted prior to or subsequent to an electroless deposition process. However, the method is not restricted to such process steps.

The method may continue on with opening the gate such that an air passage is provided to the process chamber. The microelectronic topography may then be exposed to a second set of process steps without allowing liquids within the process chamber to flow through the air passage. In some embodiments, the second set of process steps may include drying the microelectronic topography. In addition or alternatively, the second set of process steps may include any other process steps with which to process a microelectronic topography. In any case, the method may further include removing the microelectronic topography from the process chamber subsequent to exposing the topography to the first and second set of process steps. In cases in which the gate is arranged adjacent to a loading port of the process chamber, the step of removing may include moving the gate such that barriers of the gate do not block the opening of the process chamber.

As noted above, the process chamber may include a substrate holder with which to support a wafer for processing. In some embodiments, the substrate holder may be configured to prevent a substantial amount of movement of the wafer during processing. In particular, the substrate holder may, in some embodiments, include a clamping jaw adapted to prevent substantial movement of a wafer arranged upon the substrate holder. Such a clamping jaw may include a lever arranged along an edge of the substrate holder and a support member pivotally coupled to the lever. In some cases, the clamping jaw may be one of a plurality of clamping jaws spaced within the substrate holder. In general, the lever may include a first portion and a second portion. In some cases, the first portion may be longer than the second portion. In addition or alternatively, the first portion may be heavier than the second portion. In any case, the second portion may include a lip extending into a wafer receiving area of the substrate holder. In general, the clamping jaw may be configured to lower the lip upon the wafer or to a level spaced above the wafer.

Since the elemental composition of a process fluid may directly affect the reaction rate and uniformity of treating a microelectronic topography, process fluids may need to be analyzed and adjusted prior to being supplied to process chamber 22. As such, the system described herein may include analytical test equipment for monitoring fluids used within a process chamber. In general, the analytical test equipment may be used to measure the concentration of elements within the process fluid. In this manner, it can be determined whether the process fluid is in specification or if the process fluid needs to be adjusted. Such analytical test equipment may be coupled to any supply line of the system, including those coupled to inlet and outlets of the process chamber. In addition or alternatively, the analytical test equipment may be coupled to directly to the process chamber or to one or more storage tanks configured to hold process fluids used within the process chamber.

In some embodiments, it may be particularly advantageous to be able to analyze four or more components within a system. For example, embodiments in which the system is used for a plurality of processes, such as the processes conducted prior to, during, and/or subsequent to an electroless deposition process, the adaptation of being able to measure the concentration of at least four elements may be advantageous since the fluids used for the different process steps may have different compositions. In yet other embodiments, it may be advantageous to employ analytical test equipment with such an adaptation for processes which use solutions with a plurality of elements. An exemplary process using a solution with at least four elements is described in more detail below in which a four-element barrier layer is deposited. In such an embodiment, it may be particularly advantageous for the analytical test equipment to be configured to measure the concentration of at least four elements selected from the group consisting of boron, chromium, cobalt, molybdenum, nickel, phosphorus, rhenium, and tungsten. In any case, the system may further include a central processing unit (CPU) coupled to the analytical test equipment. Such a CPU may include a carrier medium comprising program instructions executable on a computer system for adjusting compositions of the fluids based upon the analysis performed by the analytical test equipment.

In general, the system described herein may be adapted to provide any process fluid for processing a microelectronic topography to a process chamber, including liquids, gases, and/or plasmas. In some embodiments, it may be particularly advantageous to perform a process using a single phase. For example, employing a single liquid phase environment may offer a manner with which to control the pressure within the process chamber. In general, increasing the pressure of a solution may advantageously increase the boiling point of the solution. In embodiments of electroless deposition, an increase in the boiling point of the deposition solution may increase the temperature at which the solution decomposes and may further allow the rate of deposition to be increased. As such, a method for electrolessly depositing a layer upon a microelectronic topography exclusively using a liquid phase is contemplated herein. In general, the method may include loading the wafer into an electroless deposition chamber, sealing the electroless deposition chamber to form an enclosed area about the microelectronic topography, and filling the enclosed area with a deposition solution. In some cases, filling the chamber may include pressurizing the enclosed area to a pressure between approximately 5 psi and approximately 100 psi, increasing the boiling point of the deposition solution. In some embodiments, the method heating the deposition solution to a temperature less than approximately 25% below the boiling point of the deposition solution to increase a reaction rate of the deposition solution with the microelectronic topography.

In some cases, a process chamber may include a particular configuration to process a microelectronic topography using a single-phase solution. For example, a process chamber is contemplated herein which includes a substrate holder and a reservoir arranged above the substrate holder and within sidewalls of the process chamber. A method for using such a process chamber is also provided herein. In general, the process chamber may be adapted to move the reservoir proximate to the substrate holder and dispense the fluids contained within the reservoir into an enclosed area laterally bound by the microelectronic topography and the reservoir. In some cases, the reservoir may include one or more valves and the process chamber may be adapted to open the valves upon moving the reservoir proximate to the substrate holder. Such valves may be generally adapted to allow bi-directional flow of the fluids between the reservoir and the microelectronic topography. In some cases, the reservoir may additionally or alternatively include a hatch. In such an embodiment, the process chamber may be adapted to move the hatch within the reservoir upon moving the reservoir proximate to the substrate. In some cases, the process chamber may be further adapted to rotate the hatch when the hatch is moved within the reservoir. In such an embodiment, it may be particularly advantageous to rotate the hatch at rate sufficient to prevent the accumulation of bubbles upon the microelectronic topography during processing. In any case, the method of processing the topography may terminate upon closing the hatch and raising the reservoir to a level spaced above the substrate holder.

Regardless of the configuration of the process chamber, a method for processing a microelectronic topography within a process chamber may include replenishing the fluids provided to the chamber for processing. Such a step of replenishing may, in some embodiments, include widening one or more outlet passages of the process chamber such that a composite second dispensing flow rate of the deposition solution through the outlets is substantially equal to the first inlet flow rate of the deposition solution. Alternatively, the step of replenishing may include decreasing the first inlet flow rate of the deposition solution to a second inlet flow rate that is substantially equal to the first dispensing flow rate of the deposition solution through outlets of the process chamber. In yet other embodiments, the step of replenishing may include decreasing the first inlet flow rate of the deposition solution to the process chamber to a second inlet flow rate and widening one or more of the outlet passages to a composite second dispensing flow rate, wherein the composite second dispensing flow rate is substantially equal to the second inlet flow rate.

In some cases, pressurizing the chamber may be advantageous for minimizing the generation and accumulation of bubbles upon a surface of a wafer during an electroless deposition process. In addition or alternatively, positioning a wafer face-up within a processing chamber may reduce generation and accumulation of bubbles upon a wafer. In yet other embodiments, agitating a solution used for an electroless deposition process may further or alternatively minimize the generation and accumulation of bubbles upon a wafer surface. As such, a method may minimizing the accumulation of bubbles upon a wafer during an electroless deposition process is provided herein. In general, the method may include loading the wafer into an electroless deposition chamber, sealing the electroless deposition chamber to form an enclosed area about the wafer, and supplying a deposition solution to the enclosed area. In addition, the method may include agitating the deposition solution to create an amount of motion sufficient to form a layer having substantially uniform thickness. In some cases, the method may further include pressurizing the enclosed area to a predetermined value, such as between approximately 5 psi and approximately 100 psi. In this manner, the steps of agitating and pressurizing may collectively reduce the amount of bubbles formed upon the wafer during the electroless deposition process. In addition or alternatively, the step of loading the wafer may include positioning the wafer face-up within the electroless deposition chamber such that the generation of bubbles may be further reduced.

In any case, agitating the deposition solution may be conducted in several different manners. For example, in some embodiments, agitating the solution may include spraying the deposition solution into the process chamber at a rate between approximately 0.1 gallons per minute and approximately 10 gallons per minute. In addition or alternatively, the supply of the deposition solution may be pulsed into the process chamber at a frequency between approximately 0.1 Hz and about 10 KHz, for example. In yet other embodiments, the process chamber may include a means for agitating a solution which is distinct from inlets and supply lines used to the supply of deposition solution to the process chamber. For example, the process chamber may include a transducer configured to supply acoustic waves, such as ultrasonic or megasonic waves, to the deposition solution. In such an embodiment, the step of agitating may include propagating the acoustic waves parallel or perpendicular to a treating surface of the wafer. In yet other embodiments, the step of agitating may include propagating the acoustic waves at an angle between approximately 0° and approximately 90° relative to a treating surface of the wafer.

In addition or alternatively, the process chamber may include a device configured to move through the deposition solution and above the wafer during processing. In some embodiments, the device may be configured to come into contact with the wafer. In other embodiments, however, the device may be configured to not come into contact with the wafer. In general, the device may include any mechanism which may cause a sufficient amount of agitation with which to remove and/or prevent the accumulation of bubbles on the surface of the underlying wafer. For example, in some embodiments, the device may include a brush with a plurality of bristles to stir the fluid within the process chamber. In yet other embodiments, the device may include a rod, block, propeller, or plate. Consequently, it is noted that the device may include any design and may traverse at any speed sufficient to cause a disturbance with which to minimize the number of bubbles of a wafer surface. In any case, the device may, in some embodiments, be adapted to dispense fluids to the wafer surface.

In addition to providing methods for processing a microelectronic topography which correlate to the system described herein, methods for forming a contact structure or a via within a dielectric layer are also provided. It is noted that the methods described below may be conducted using the system described herein, but are not restricted to the use of such a system. Furthermore, the different process steps used to form a contact structure are not necessarily co-dependent and, therefore, may be performed independent of each other.

In some embodiments, the method for forming a contact structure or via within a dielectric layer may include forming a liner layer upon a microelectronic topography and converting at least a portion of the liner layer to a hydrated oxide layer. In some cases, the step of converting may include exposing the liner layer to an oxidizing plasma. In yet other embodiments, the step of converting may include exposing the liner layer to an oxidizing fluid. In either case, the liner layer may include a metal layer in some embodiments. For example, the liner layer may include a metal selected from a group consisting of tantalum, tantalum nitride, tantalum silicon nitride, tantalum carbon nitride, titanium, titanium nitride, titanium silicon nitride, tungsten and tungsten nitride.

In some embodiments, the liner layer may include a combination of such materials, such as a stack of tantalum nitride and tantalum or a stack of titanium and titanium nitride, for example. In either case, the step of converting a portion of the liner layer may include forming a metal oxide layer. For example, in embodiments in which the liner layer includes tantalum and the hydrated metal oxide layer may include tantalic acid. In yet other embodiments, the liner layer may include a dielectric material, such as silicon nitride, silicon carbide, silicon carbon nitride, silicon oxycarbide, silicon oxycarbon nitride, and/or any organic materials generally known for use in microelectronic fabrication. In such an embodiment, a portion of the liner layer may be converted into a hydrated and oxidized dielectric layer.

In any case, the method may further include depositing a metal layer upon the hydrated oxide layer. Consequently a microelectronic topography may be formed which includes a hydrated oxide layer and a metal layer formed upon and in contact with the hydrated oxide layer. More specifically, in embodiments in which the liner layer includes a metal, a microelectronic topography may be formed which includes a hydrated metal oxide layer and a metal layer formed upon and in contact with the hydrated metal oxide layer. In some embodiments, the metal layer may be electroless deposited upon the hydrated oxide layer. In other embodiments, however, the metal layer may be deposited using processes other than electroless techniques. In some embodiments, the method may include converting the hydrated oxide layer to an oxide layer subsequent to the deposition of the metal layer. Such a conversion the hydrated oxide layer to the oxide layer may include heating the microelectronic topography to a temperature greater than approximately 400° C. In yet other embodiments, the method may include converting the hydrated oxide layer a different material subsequent to the step of deposition the metal layer. For example, in an embodiment in which the hydrated oxide layer includes a metal, the method may include converting a hydrated metal oxide layer into a metal layer. Such a conversion of the hydrated metal oxide layer to the different material may include annealing the microelectronic topography in an ambient comprising hydrogen.

In yet other embodiments, the method for forming a contact structure or via within a dielectric layer may additionally or alternatively include selectively depositing a second dielectric layer upon a first dielectric layer and selectively depositing a metal layer upon portions of the topography arranged adjacent to the first dielectric layer such that the deposition of the metal layer upon the first dielectric is minimized. In some embodiments, the step of selectively depositing the second dielectric layer may include depositing a hydrophobic material. Such a hydrophobic material may be deposited by exposing the microelectronic topography to dichlorodimethylsilane or any xylene material configured to form a hydrophobic material. More specifically, the hydrophobic material may be deposited using organic vapor deposition.

In some embodiments, the method may further include removing the second dielectric layer subsequent to the step of selectively depositing the metal layer. In yet other cases, the second dielectric layer may remain within the microelectronic topography for further processing. In either case, a microelectronic topography may be formed which includes a metal feature having a second metal layer formed upon and in contact with a first metal layer. In addition, the microelectronic topography may include a dielectric portion having a lower layer of hydrophilic material and upper layer of hydrophobic material. In some embodiments, the dielectric portion may have a lower surface substantially coplanar with a lower surface of the metal feature. In addition or alternatively, the upper surfaces of the lower layer and the second metal layer may be substantially coplanar. In any case, the thickness of the upper portion may be less than approximately 500 angstroms.

Another microelectronic topography which may be formed using the methods described herein may include a metal feature having a single layer comprises at least four elements lining a lower surface and sidewalls of the metal feature. In some embodiments, the single barrier layer may include at least four elements selected from a group consisting of boron, chromium, cobalt, molybdenum, nickel, phosphorus, rhenium, and tungsten. In addition, the concentration of elements within the single barrier layer may include three elements each comprising between approximately 0.1% and approximately 20% of a molar concentration of the barrier layer and a fourth element comprising the balance of the molar concentration. In some embodiments, the fourth element may include cobalt or nickel. In some embodiments, the single barrier layer may be configured to substantially prevent oxidation. In addition or alternatively, the single barrier layer may be configured to substantially prevent diffusion of a bulk metal layer formed upon the single barrier layer to other layers within the microelectronic topography. In some embodiments, the metal feature may further include a second single barrier layer comprising at least four elements arranged upon and in contact with the bulk metal layer.

There may be several advantages to using the system and methods described herein. For example, a system is provided which is adapted to conduct one or more process steps within a chamber without removing the wafer arranged within the chamber. In this manner, the deposition of foreign particles and oxidation of the topography may be minimized. In addition, a process chamber is provided which prevents process solutions from mixing upon being dispensed from the process chamber. Consequently, one or more of the process fluids used in the process chamber may be recycled, reducing material and waste disposal costs associated with the process. Moreover, a substrate holder is provided which is adapted to secure a wafer within a chamber such that a wafer is not damaged during processing. In addition, a gate adapted to provide an air passage to the process chamber during processing is provided. In this manner, ambient air exterior to the process chamber may be supplied to the process chamber for a drying process, for example. Furthermore, a method and a system for reducing the generation and accumulation of bubbles upon a wafer surface during processing is provided. As a result, a substantially uniform layer may be deposited. In some cases, the method and system described herein may increase the boiling point of an electroless deposition solution used within a process chamber. Such an increase in the boiling point may, in some embodiments, may be used to increase the deposition rate of the layer, increasing production throughput of the system.

Additional benefits may also be realized by the method of hydrating the barrier layer prior to an electroless deposition process. In particular, such a process may advantageously allow the barrier layer to be readily available for the deposition of a catalytic seed layer while preventing the accumulation of particulate matter upon the barrier layer. Consequently, a more uniform bulk metal layer may be deposited thereon. In embodiments in which the barrier is formed to include at least four elements, the barrier layer may be autocatalytic and, therefore, may not need the extraneous process steps of activating the barrier layer. Furthermore, the method which deposits a hydrophobic layer upon dielectric portion of the topography prior to the deposition of a cap layer may advantageously prevent the deposition of a the layer upon dielectric portions of a topography, potentially preventing the formation of a short within the device.

BRIEF DESCRIPTION OF THE DRAWINGS

Other objects and advantages of the invention will become apparent upon reading the following detailed description and upon reference to the accompanying drawings in which.

Figure 1:
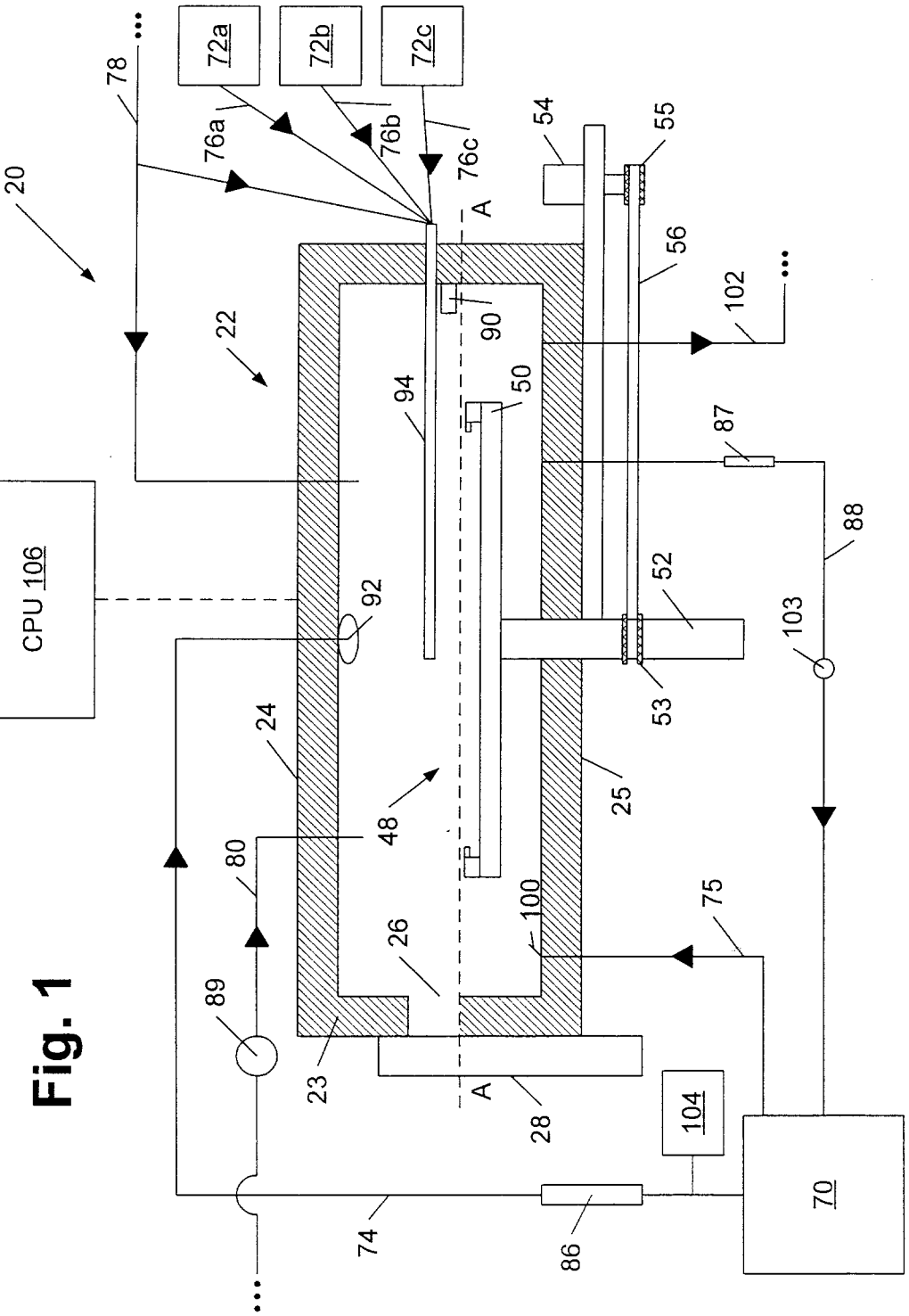
FIG. 1 depicts a schematic diagram of a system for processing a microelectronic topography.
Figure 2:
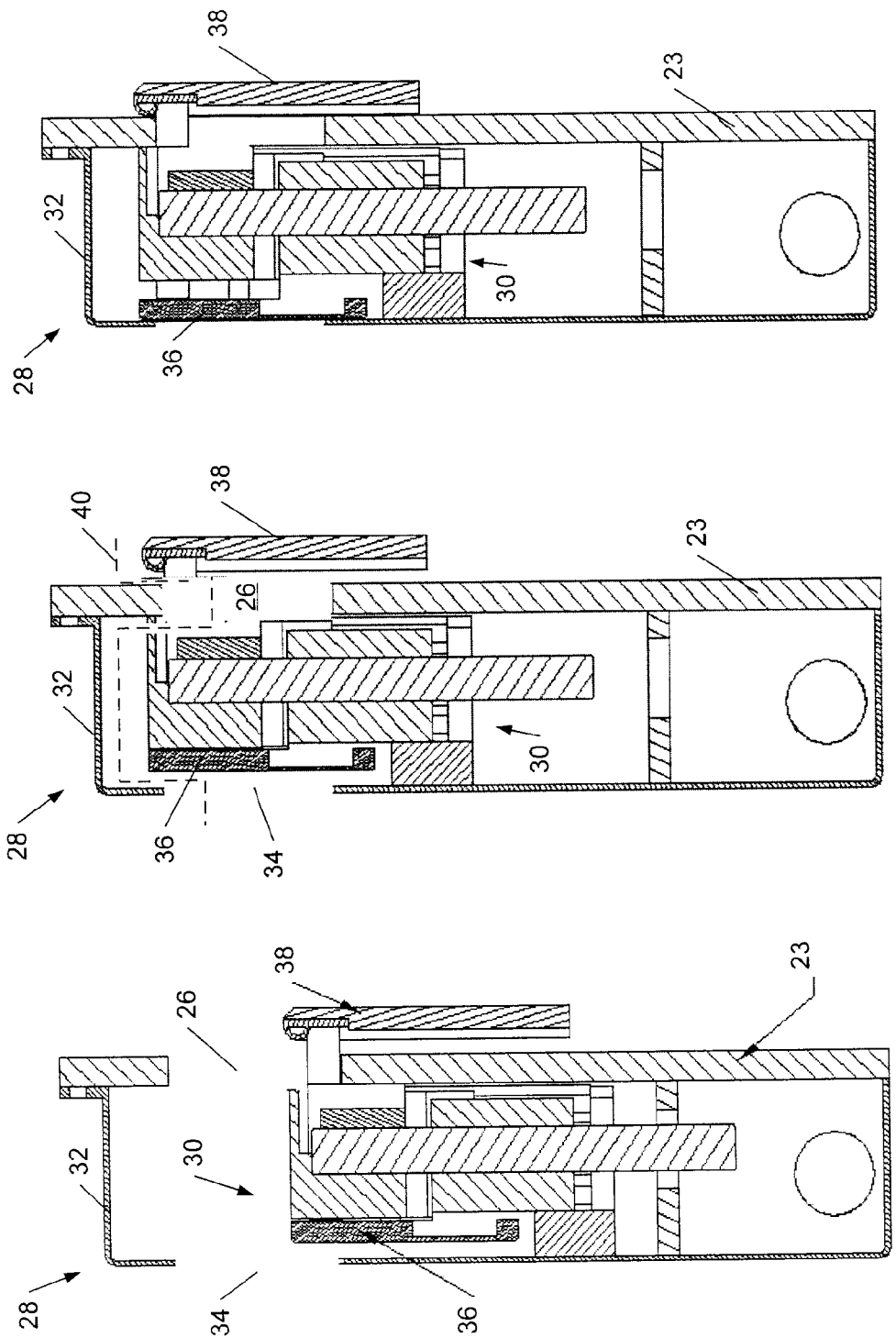
FIG. 2a depicts a partial cross-sectional view of a gate attached to a process chamber in an open position.
FIG. 2b depicts a partial cross-sectional view of the gate from FIG. 2a in an unsealed closed position.
FIG. 2c depicts a partial cross-sectional view of the gate from FIG. 2a in sealed position.

While the invention is susceptible to various modifications and alternative forms, specific embodiments thereof are shown by way of example in the drawings and will herein be described in detail. It should be understood, however, that the drawings and detailed description thereto are not intended to limit the invention to the particular form disclosed, but on the contrary, the intention is to cover all modifications, equivalents and alternatives falling within the spirit and scope of the present invention as defined by the appended claims.

DETAILED DESCRIPTION OF THE PREFERRED EMBODIMENTS

Turning now to the drawings, exemplary embodiments of systems and methods for processing a microelectronic topography are illustrated in FIGS. 1-18. More specifically, FIG. 1 illustrates an exemplary embodiment of a system that may be used for processing a microelectronic topography, while FIGS. 2a-10 show detailed illustrations of particular components of the system in FIG. 1 as well as methods of using such a system. Furthermore, FIGS. 11-18 illustrate a method for processing a microelectronic topography which may be conducted using the system shown in FIG. 1 or any other system adapted for such a method. It is noted that the plurality of component designs and methods illustrated in FIGS. 1-18 are not co-dependent and, therefore, may not necessarily be employed together. In particular, the system described herein may be constructed to include any combination of the components described in reference to FIGS. 1, 2a-2c, 4, 6a-6d, 8a, 8b, and 9a-9c. In addition, the methods for processing a microelectronic topography, as described herein, may include any one or a plurality of the methods discussed in reference to FIGS. 3, 5, 7, and 10-18.

The system illustrated in FIG. 1 is designated, as a whole, by reference numeral 20. In general, system 20 may include process chamber 22 with which to process a microelectronic topography. More specifically, process chamber 22 may be used for one or more processes steps used to fabricate a microelectronic device, such as depositing, etching, activating, polishing, cleaning, rinsing, drying, or any combination of such processes. In a preferred embodiment, process chamber 22 may be used for any of the processes associated with an electroless deposition process, including any processes performed prior to, during, or subsequent to an electroless deposition process. For example, in some cases, process chamber 22 may be used to activate a surface of a microelectronic topography such that a layer may be subsequently deposited using an electroless process within process chamber 22 or within a different process chamber. In addition or alternatively, process chamber 22 may be used for polishing and/or cleaning an electrolessly deposited layer as well as depositing a cap layer upon the electroless deposited layer. In yet other embodiments, process chamber 22 may be used for processes not associated with an electroless deposition process.

As shown in FIG. 1, process chamber 22 may have a plurality of auxiliary components arranged therein and coupled thereto. In particular, process chamber 22 may include chamber walls, a cover, a substrate holder, a means for dispensing fluids within the chamber, as well as a plurality of other components as described in more detail below. In addition, process chamber 22 may be coupled to a plurality of supply lines, storage tanks, and process control devices, such as but not limited to temperature and pressure gauges. In general, the components of process chamber 22 may be made of or may have a surface coated with a chemically stable material that can withstand the action of aggressive solutions used within process chamber 22. Such a material may further be stable with temperatures ranging between approximately −20° C. and approximately 800° C. and pressures ranging between approximately 1 psi and approximately 150 psi. Examples of such materials are Teflon, ceramics of certain types, or the like.

In addition, process chamber 22 may be configured to be hermetically sealed such that, in a closed state, the interior of process chamber 22 may be isolated from an ambient exterior to process chamber 22. In this manner, the pressure within process chamber 22 may be regulated. More specifically, process chamber 22 may be pressurized to a level greater than, equal to, or less than the pressure of the ambient exterior to process chamber 22. In some cases, the lower edge of the cover 24 may be beveled to prevent accumulation of solution on the cover. As a result, cross contamination of fluids between processes may be prevented. In addition, process chamber 22 may be mounted at any angle relative to the position illustrated in FIG. 1. In particular, process chamber 22 may be mounted with cover 24 above base 25 as shown in FIG. 1, with cover 24 and base 25 side by side, or with base 25 above cover 24.

In general, process chamber 22 may be adapted to provide an opening with which to load one or more wafers upon substrate holder 48. In particular, process chamber 22 may include loading port 26 along chamber wall 23 as shown in FIG. 1. In general, one or more wafers may be loaded through loading port 26 via a mechanical arm installed outside process chamber 22. In some embodiments, process chamber 22 may include gate 28 arranged adjacent to loading port 26 to control access to the interior of process chamber 22. An exemplary configuration of gate 28 is illustrated in FIGS. 2a-2c and is described in more detail below. As noted in reference to FIGS. 2a-2c, however, gate 28 may not be used to allow a wafer to be loaded therethrough, in some embodiments. Rather, gate 28 may simply be adapted to provide an air passage to process chamber 22. As such, in some embodiments, gate 28 may not be arranged adjacent to loading port 26. In yet other embodiments, process chamber 22 may not include gate 28 at all. As such, in some cases, process chamber 22 may include an alternative means for providing access to the interior of process chamber 22 such that a wafer may be positioned upon substrate holder 48. For instance, in some cases, loading port 26 may be positioned along another portion of chamber wall 23. In yet other embodiments, cover 24 may be configured to allow a wafer to be loaded onto substrate holder 48.

Turning to FIGS. 2a-2c, an exemplary illustration of gate 28 is shown. As shown in FIGS. 2a-2c, gate 28 may be coupled to chamber wall 23. As noted above, however, gate 28 may alternatively be arranged adjacent to cover 24. In general, gate 28 may provide access and/or an air passage to process chamber 22 as well as a manner with which to seal the process chamber. In particular, FIG. 2a illustrates gate 28 in a position to provide access to process chamber 22 such that one or more wafers may be loaded therein. FIG. 2b, on the other hand, illustrates gate 28 in a position to provide an air passage to process chamber 22 while prohibiting fluid within the process chamber from escaping through gate 28. The position of gate 28 to seal process chamber 22 is illustrated in FIG. 2c.

In general, gate 28 may include gate latch 30 and gate casing 32. As shown in FIGS. 2a-2c, gate latch 30 may be interposed between chamber wall 23 and gate casing 32. Gate casing 32 may have opening 34 and may be arranged such that opening 34 is spaced laterally adjacent to opening 26 within chamber wall 23. In some embodiments, gate casing 32 may be arranged such that openings 34 and 26 are in direct lateral alignment with each other as shown in FIGS. 2a-2c. In such an embodiment, openings 34 and 26 may include dimensions large enough to allow one or more wafers to be loaded within the process chamber. In yet other embodiments, openings 34 and 26 may not necessarily need to have dimensions that large. In particular, openings 34 and 26 may not necessarily need to have dimensions large enough to allow one or more wafers to be loaded within the process chamber when gate 28 is simply used to provide an air passage to process chamber 22 as described in more detail below. In such an embodiment, openings 34 and 26 may not necessarily be in direct lateral alignment with each other.

In general, gate latch 30 may be configured to align barriers 36 and 38 with the openings 34 and 26, respectively. Such a configuration may include sliding gate latch 30 between chamber wall 23 and gate casing 32. Although FIGS. 2a and 2b indicate that such a sliding movement is started with gate latch 30 positioned below openings 34 and 26, gate latch 30 may alternatively be positioned above the openings prior to such a movement. In yet other embodiments, gate latch 30 may have barriers 36 and 38 permanently located in lateral alignment with openings 34 and 26. In such an embodiment, gate latch 30 may not be used to load a wafer into process chamber 22. Rather, gate latch 30 may simply be used to provide an air passage to process chamber 22 and/or seal process chamber 22. In any case, when barriers 36 and 38 are respectively aligned with openings 34 and 26, the portion of gate latch 30 comprising barriers 36 and 38 may be configured to provide an air passage to process chamber 22 as shown by dotted line 40 in FIG. 2b or may be configured to move such that the two openings are sealed as shown in FIG. 2c. As noted above, the position illustrated in FIG. 2b may provide an air passage to process chamber 22 while prohibiting fluid within the process chamber from escaping through gate latch 30. In this manner, gate latch 30 may offer a manner with which to provide air to process chamber 22 while processing a wafer therein. Processes employing such an air passage may include, for example, a drying process. In some embodiments, process chamber 22 may employ a vacuum with which to draw air from the air passage.

Figure 3:
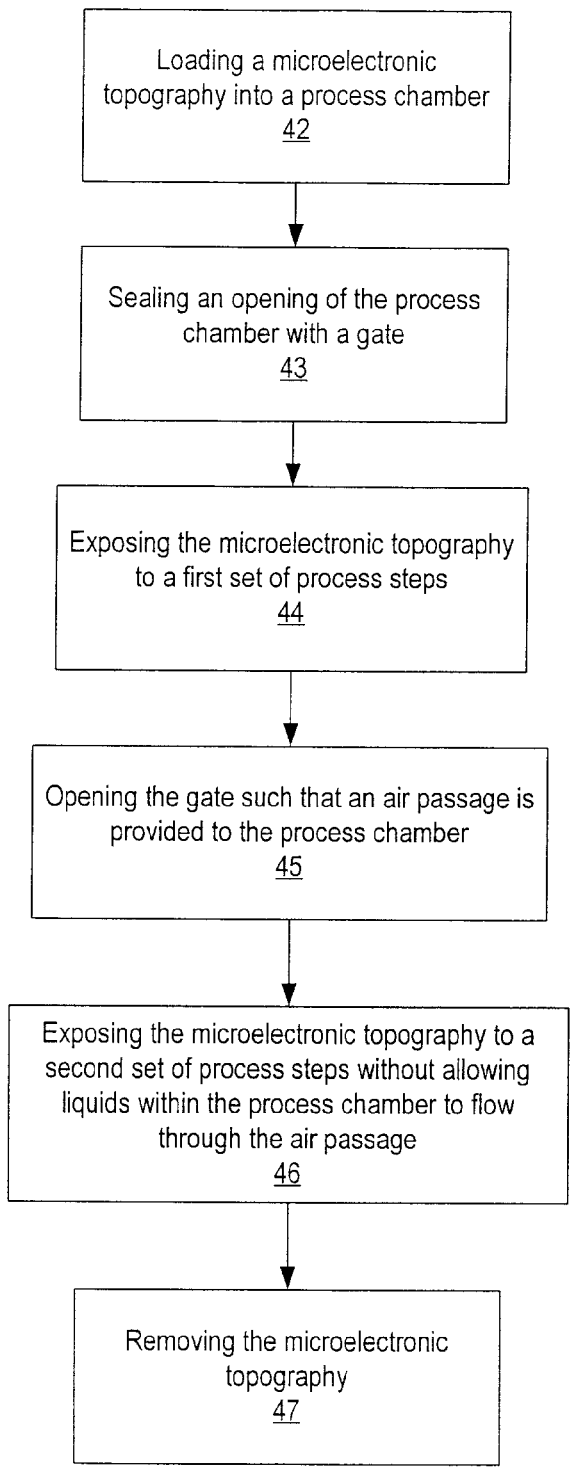
FIG. 3 depicts a flow chart for processing a microelectronic topography using a process chamber with a gate attached thereto.

In any case, a method for processing a microelectronic topography within a process chamber having a gate similar to gate 28 is depicted in FIG. 3. In particular, FIG. 3 illustrates a method which includes loading a microelectronic topography into a process chamber as shown in step 42. Such a step of loading may include introducing the microelectronic topography through an opening of the process chamber that serves as a loading port of the chamber. The method may further include sealing an opening of the process chamber with a gate as shown in step 43. In some cases, the gate may be used to seal the loading port of the chamber. As such, in some embodiments, the step of sealing may include moving the gate such that barriers of the gate are in alignment with the opening of the process chamber. In other embodiments, however, the gate may be used to seal an opening of the chamber which is distinct from the loading port of the chamber. In either case, the method may further include step 44 in which the microelectronic topography is exposed to a first set of process steps. In some embodiments, the first set of process steps may include electrolessly depositing a layer upon the microelectronic topography as well as process steps conducted prior to or subsequent to an electroless deposition process. However, the method is not restricted to such process steps.

As noted in FIG. 3, the method may continue onto step 45 in which the gate is opened such that an air passage is provided to the process chamber. The microelectronic topography may then be exposed to a second set of process steps without allowing liquids within the process chamber to flow through the air passage as indicated in step 46. In some embodiments, the second set of process steps may include drying the microelectronic topography. In addition or alternatively, the second set of process steps may include any other process steps with which to process a microelectronic topography. In any case, the method may further include removing the microelectronic topography from the process chamber subsequent to exposing the topography to the first and second set of process steps as indicated in step 47. In cases in which the loading port of the process chamber is surrounded by the gate casing comprising the gate, the step of removing may include moving the gate such that barriers of the gate do not block the opening of the process chamber.

Returning to FIG. 1, process chamber 22 may include substrate holder 48 with which to support a wafer. In particular, substrate holder 48 may include platen 50 supported by shaft 52, which passes through base 25 of process chamber 22. Although substrate holder 48 is shown to hold a single wafer, other substrate holders configured to hold multiple wafers may be alternatively arranged included within process chamber 22. As such, process chamber 22 is not restricted to processing a single wafer. Rather, process chamber 22 may be either adapted for batch processing (i.e., processing multiple wafers at once) or may be adapted to process wafers sequentially (i.e., processing one wafer at a time). In any case, substrate holder 48 may be arranged such that a wafer may be positioned horizontally as shown in FIG. 1. In other embodiments, substrate holder 48 may be arranged such that a wafer is positioned vertically. In yet other cases, substrate holder 48 may be arranged to have wafers positioned at an angle between 0° and 90° relative to base 25.

In either case, substrate holder 48 may be configured to rotate. In particular, the outer end of shaft 52 may be rigidly coupled to gear wheel 53, which may be driven into rotation by motor 54. More specifically, the output shaft of motor 54 may be coupled to gear wheel 55 and gear wheels 53 and 55 may be interconnected via a synchronization belt 56 such that shaft 52 and, thus, substrate holder 48 may be rotated. Such an adaptation to rotate may advantageously allow process fluids introduced into process chamber 22 to be uniformly distributed across an entire wafer. As a result, the treatment performed upon the wafer may be more uniform. It is noted that the arrangement of the components with which to rotate substrate holder 48 in FIG. 1 is merely an exemplary configuration. As such, other configurations for rotating substrate holders known in the microelectronic fabrication industry may be used within system 20. In yet other embodiments, substrate holder 48 may not be configured to rotate. Rather, process chamber 22 may include other means with which to rotate a wafer. Alternatively, process chamber 22 may not be configured to rotate a wafer at all.

Figure 4:
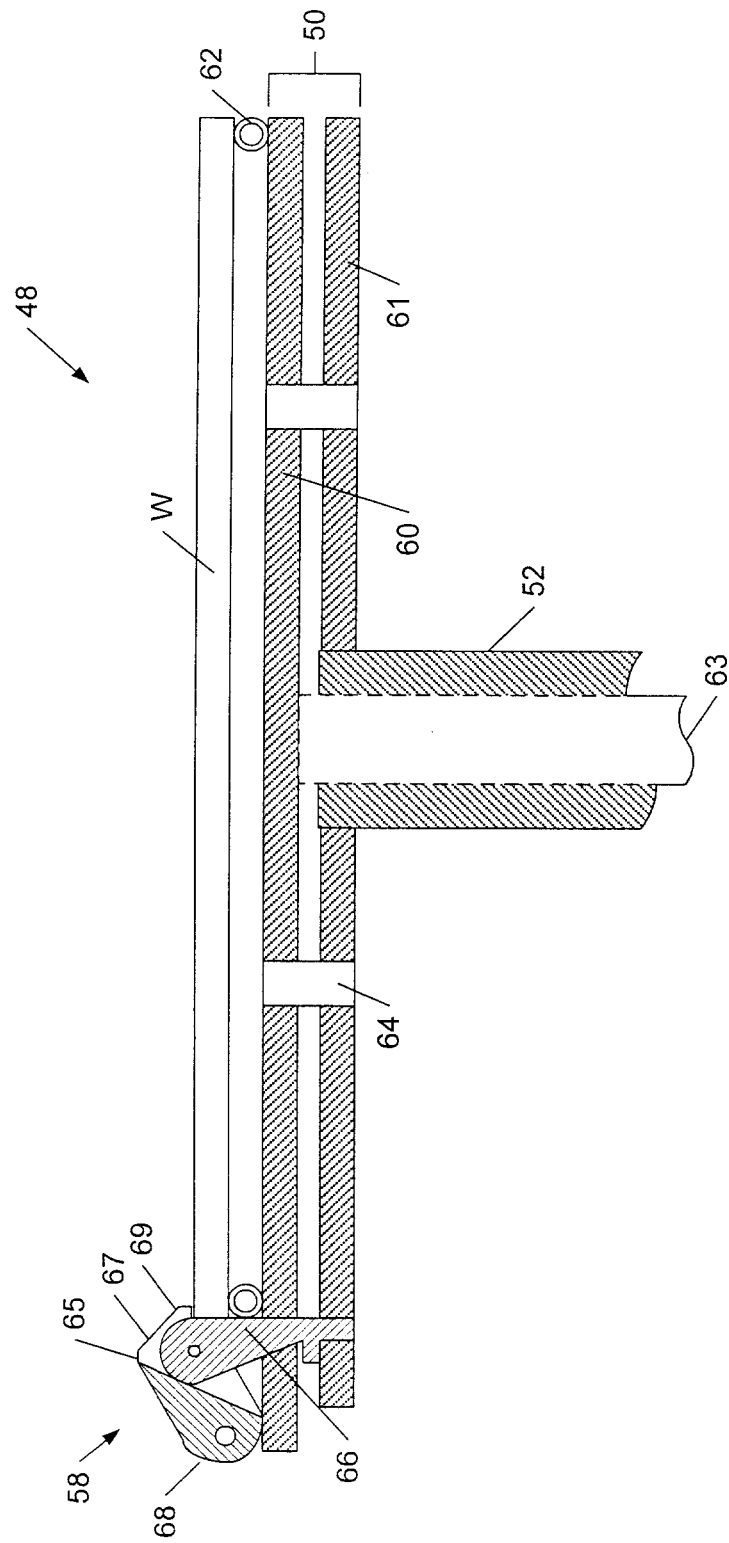
FIG. 4 depicts a partial cross-sectional view of a substrate holder.

In some cases, substrate holder 48 may be configured to secure a wafer such that movement of the wafer relative to the substrate holder is minimized. An exemplary substrate holder having such a configuration is shown in FIG. 4. In particular, FIG. 4 illustrates a cross-sectional view of substrate holder 48 securing wafer W above platen 50 by means of clamping jaw 58. It is noted that illustration of the substrate holder in FIG. 4 is merely an exemplary configuration of a substrate holder that may be included within the process chamber described herein. In no way is process chamber 22 is restricted to the inclusion of such a configuration. Consequently, process chamber 22 may additionally or alternatively include several other substrate holder configurations with which to support a wafer. For example, substrate holder 48 may, in some embodiments, include a vacuum-activated mechanism with which to secure a wafer to the substrate holder.

As shown in FIG. 4, clamping jaw 58 may be arranged along the edge of substrate holder 48 such that the edge of wafer W is secured. It is noted that clamping jaw 58 may be one of a plurality of clamping jaws arranged along the periphery of substrate holder 48, but only one clamping jaw is shown in FIG. 4 to simplify the drawing. As such, in some embodiments, the substrate holder illustrated in FIG. 4 may also include a clamping jaw along the opposite edge of substrate holder, although substrate holder 48 is not restricted to such a configuration. In general, the number of clamping jaws to include within a substrate holder may depend on the size of the wafer to be processed and/or the type of processing to be conducted within the process chamber. For example, in some cases, the number of clamping jaws may be optimized such that a wafer may be secured without having superfluous number of jaws with which to complicate the substrate holder configuration. In general, the plurality of clamping jaws may have a substantially similar configuration as clamping jaw 58. In addition, the plurality clamping jaws may be uniformly or non-uniformly arranged about the periphery of substrate holder 48.

In some embodiments, clamping jaw 58 may be configured to secure wafer W when platen 50 includes moveable platen 60 arranged above fixed base platen 61. In other embodiments, however, the adaptations of platens 60 and 61 may be reversed. In particular, platen 50 may include a fixed platen arranged above a moveable platen. Although the configuration of clamping jaw 58 to secure wafer W upon substrate holder 48 is described below in reference to platen 60 being moveable and platen 61 being fixed, clamping jaw 58 is not restricted to such a configuration. In particular, clamping jaw 58 may be modified to accommodate the alternative adaptations of platens 60 and 61. In this manner, the concept of using a clamping jaw having the configuration described herein may be used in either case.

In some embodiments, substrate holder 48 may be configured to receive wafer W directly upon moveable platen 60. In yet other embodiments, however, substrate holder 48 may be configured to support wafer W above moveable platen 60. For example, in some embodiments, substrate holder 48 may include annular seal 62 arranged upon moveable platen 60 and configured to receive wafer W, as shown FIG. 4. Such an annular seal may be used to seal the backside of wafer W to moveable platen 60 such that process solutions used during treatment of the front side of the wafer do not contaminate the backside of the wafer. In any case, the area above moveable platen 60 and extending in from clamping jaw 58 to the other end of substrate holder 48 may be referred to as a "wafer receiving region," as used herein. As shown in FIG. 4, shaft 52 may include a central hole through which rod 63 may be inserted and configured to slide through. The upper end of rod 63 may be coupled to the bottom of the movable platen 61 such that when an upward force is applied to rod 63, moveable platen 60 may rise relative to fixed base platen 61 as shown in FIG. 4. In some embodiments, substrate holder 48 may include pins 64 rigidly supported in fixed base platen 61 and slidingly inserted within openings of moveable platen 60. Such pins may be configured to further support wafer W when moveable platen 60 is lowered toward fixed base platen 61. In yet other cases, substrate holder 48 may not include pins.

In any case, clamping jaw 58 may be configured to move upon raising moveable platen 60 such that wafer W may be secured. More specifically, clamping jaw 58 may include lever 65 pivotally coupled to support member 66, which may be rigidly attached to fixed base platen 61. In a preferred embodiment, lever 65 may include portion 67, which is pivotally coupled to support member 66, and portion 68 extending outward from support member 66. In this manner, lever 65 may be tilted upon raising moveable platen 60. In some cases, portion 67 may be lighter and/or shorter than portion 68 to augment such a tilting motion. In yet other embodiments, however, there may not be a weight or length distinction between portions 67 and 68. As shown in FIG. 4, portion 67 may include lip 69 extending inward from support member 66. Upon tilting lever 65, lip 69 may extend beyond the periphery of wafer W such that vertical motion of the wafer is minimized or prohibited. In some cases, lip 69 may extend to a level spaced above wafer W. Such an adaptation may be particularly advantageous for minimizing the amount of damage sustained to the edge of wafer W as shown in FIG. 4. In yet other embodiments, however, lip 69 may come into contact with wafer W. In either case, support member 66 may be positioned such that the lateral movement of wafer W is minimized. In this manner, the vertical and lateral movement of wafer W may be minimized through the use of clamping jaw 58.

Returning back to FIG. 1, system 20 may include one or more supply lines with which to supply various fluids to process chamber 22. In addition, system 20 may include one or more reservoirs with which to store such fluids. As noted above, process chamber 22 may be used for any microelectronic fabrication process, including but not limited to, depositing, etching, activating, polishing, cleaning, rinsing, drying, or any combination of such processes. As such, the various fluids supplied to process chamber 22 may include any fluids, including liquids and/or gases, used for the fabrication of a microelectronic device. In some cases, however, the various fluids may be associated with processes that treat a microelectronic topography prior to, during, and/or subsequent to an electroless deposition process. For example, reservoir 70 may include an electroless deposition solution, while auxiliary tanks 72a, 72b, and 72c may include fluids for the treatment of a wafer prior to or subsequent to an electroless deposition process. More specifically, auxiliary tanks 72a, 72b, and 72c may include various fluids used for the activation, cleaning, rinsing, and/or drying of a microelectronic topography prior to or subsequent to an electroless deposition process. In yet other embodiments, however, reservoir 70 and auxiliary tanks 72a, 72b, and 72c may be used to store fluids for microelectronic fabrication processes other than those associated with an electroless deposition process.

It is noted that system 20 is not restricted to the aforementioned designation of chemicals for reservoir 70 and auxiliary tanks 72a, 72b, and 72c. In particular, reservoir 70 may include may include any of the various fluids used for the activation, cleaning, rinsing, and/or drying of a microelectronic topography prior to or subsequent to an electroless deposition. In addition, any of auxiliary tanks 72a, 72b, and 72c may include a deposition solution. Furthermore, system 20 may be adapted to provide additional deposition solutions to process chamber 22 in some embodiments. In particular, system 20 may include a plurality of reservoirs and supply lines for supplying deposition solutions to process chamber 22, including solutions for electroless deposition and non-electroless deposition. In this manner, process chamber 22 may be used for depositing different materials upon a wafer without having to take the wafer out of the chamber.

As shown in FIG. 1, reservoir 70 and auxiliary tanks 72a, 72b, and 72c may be coupled to inlet ports of process chamber 22 via supply lines. In particular, reservoir 70 may be coupled to supply line 74 and auxiliary tanks 72a, 72b, and 72c may be coupled to supply lines 76a, 76b, and 76c. In some cases, reservoir 70 may be further coupled to supply line 75, which is connected to the bottom of the process chamber 22. Such an additional supply line may offer an alternative method or additional means with which to introduce the fluid from reservoir 70. For example, supply line 75, in some embodiments, may be coupled to an inlet adapted to indirectly project a fluid on a wafer residing on substrate holder 48. Such an adaptation is described in more detail below with reference to the means for distributing fluids into process chamber 22.

In some cases, system 20 may include supply lines other than the ones coupled to reservoir 70 and auxiliary tanks 72a, 72b, and 72c. For example, system 20 may include supply line 78 for supplying a rinsing solution, such as deionized water, to process chamber 22. In addition or alternatively, system 20 may include one or more supply lines, such as supply line 80, for supplying a compressed gas to process chamber 22. In some embodiments, the compressed gas may be inert and may be used to simply further pressurize process chamber 22 as discussed in more detail below. In yet other embodiments, supply line 80 may be used to supply a chemical reagent gas with which to process the wafer. In some cases, a plasma may be generated within process chamber 22 using the reagent gas. In such an embodiment, process chamber 22 may include an ionizing coil with which to form the plasma. In yet other embodiments, a wafer may be treated with reagent gas in its gas phase.

Consequently, the reference of "fluids" to process a microelectronic topography, as used herein, may refer to liquids, gases, or plasmas, including gases in a standard state or an excited state (i.e., a photon-activated gas state). The fluids in any of such states of matter may be used at pressures below, at, or above atmospheric pressure as well as at temperatures associated with the respective process step of the fabrication process. In any case, the fluid introduced through supply line 80 may, in some embodiments, be used to dry a wafer arranged within process chamber 22. In yet other embodiments, supply line 80 may not be used to dry a wafer. In any case, supply lines which are coupled to a moving part of process chamber 22, such as cover 24, for example, the supply lines may be made in the form of hoses or other flexible pipings.

Although supply lines 78 and 80 are shown coupled to cover 24 in FIG. 1, supply lines 78 and 80, as well as supply lines 74, 75, 76a, 76b, and 76c may be coupled at any location along process chamber 22. In addition or alternatively, supply lines 78 and 80 may be coupled to other inlets of process chamber 22. For example, supply line 78 may be additionally or alternatively coupled to dispensing arm 94 as shown in FIG. 1. Furthermore, although supply lines 78 and 80 are specifically referenced as respectively supplying a rinsing solution and compressed gas to process chamber 22, the lines are not restricted to such a function. Rather, supply lines 78 and 80 may be used to supply any type of fluid to process chamber 22. In yet other embodiments, supply lines 78 and/or 80 may be omitted from process chamber 22. Similarly, any of supply lines 74, 75, 76a, 76b, and 76c may be used to supply any type of fluid to process chamber 22 or may, alternatively, be omitted from process chamber 22.

In either case, the processes conducted within process chamber 22 may include single or multi-phase operations. More specifically, the processes conducted within process chamber 22 may employ a single phase operation, such as one primarily comprising a liquid, a gas, or a plasma. Alternatively, the processes conducted within process chamber 22 may use a multi-phase operation, having a combination of liquid, gas, and/or plasma. In some embodiments, employing a single liquid phase environment may offer a manner with which to control the pressure within process chamber 22. The benefits of controlling pressure within process chamber 22 is described in more detail below. In general, however, increasing the pressure within process chamber 22 will increase the boiling point of a solution used within the chamber and may consequently increase the reaction rate of the process within process chamber 22.

Figure 5:
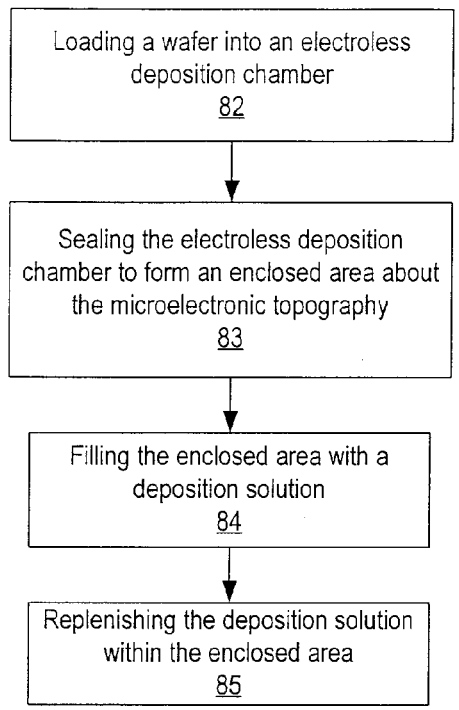
FIG. 5 depicts a flow chart for processing a microelectronic topography exclusively employing a liquid phase environment.

A method for electrolessly depositing a layer upon a microelectronic topography in single liquid phase environment is illustrated in FIG. 5. In general, the method may include loading the microelectronic topography into an electroless deposition chamber and sealing the deposition chamber to form an enclosed area about the topography as shown in steps 82 and 83, respectively. The method may continue to step 84 in which the entirety of the enclosed area is filled with a deposition solution such that no gas is present. In particular, the step of filling may include introducing the deposition solution at a first inlet flow rate and narrowing one or more outlet passages of the electroless deposition chamber such that a composite first dispensing flow rate of the deposition solution through the outlets is less than the first inlet flow rate. In general, the flow rates of the fluid in the inlet passages and outlet passages may be controlled by a fluid flow controller coupled to process chamber 22. It is noted that the first inlet flow rate may be introduced through one or more inlets of the chamber. Such a process of filling may pressurize the enclosed area to a pressure between approximately 5 psi and approximately 100 psi, increasing the boiling point of the deposition solution. In some embodiments, the method may include heating the deposition solution to a temperature less than approximately 25% below the boiling point of the deposition solution to increase a reaction rate of the deposition solution with the microelectronic topography. Consequently, pressurizing the enclosed area of the process chamber may, in some embodiments, aid in increasing the deposition rate of the process.

In any case, the method may, in some embodiments, include replenishing the deposition solution within the enclosed area as shown in step 85. Such a step of replenishing may, in some embodiments, include widening one or more outlet passages of the process chamber such that a composite second dispensing flow rate of the deposition solution through the outlets is substantially equal to the first inlet flow rate of the deposition solution. Alternatively, the step of replenishing may include decreasing the first inlet flow rate of the deposition solution to a second inlet flow rate that is substantially equal to the first dispensing flow rate of the deposition solution through outlets of the process chamber. In yet other embodiments, the step of replenishing may include decreasing the first inlet flow rate of the deposition solution to the process chamber to a second inlet flow rate and widening one or more of the outlet passages to a composite second dispensing flow rate, wherein the composite second dispensing flow rate is substantially equal to the second inlet flow rate.

An exemplary configuration of process chamber 22 adapted to expose a microelectronic topography to a single phase process is illustrated in FIGS. 6a-6d. As noted above, process chamber 22 may be adapted to perform a succession of different process steps. As such, although process chamber 22 is shown in FIG. 6a-6d without any of the auxiliary components described in reference to FIG. 1, the process chamber shown in FIG. 6a-6d may be coupled to such components. In particular, the process chamber 22 illustrated in FIGS. 6a-6d may be coupled to supply lines, exhaust lines, temperature and pressure gauges and controls, storage tanks, and a CPU unit. In addition or alternatively, the process chamber illustrated in FIG. 6a-6d may include a plurality of input ports, such as but not limited to shower element 92 and dispensing arm 94. The exclusion of such components within FIGS. 6a-6d is merely to simplify the illustration of the drawings and, therefore, does not necessarily indicate the absence of such components. Consequently, the process chamber illustrated in FIG. 6a-6d is not necessarily restricted to processing a microelectronic topography solely with the use of a reservoir as described in more detail below. Rather, the description of process chamber 22 in reference to FIGS. 6a-6d simply offers one method of a plurality of methods with which to treat a topography within the process chamber.

Figure 6A:
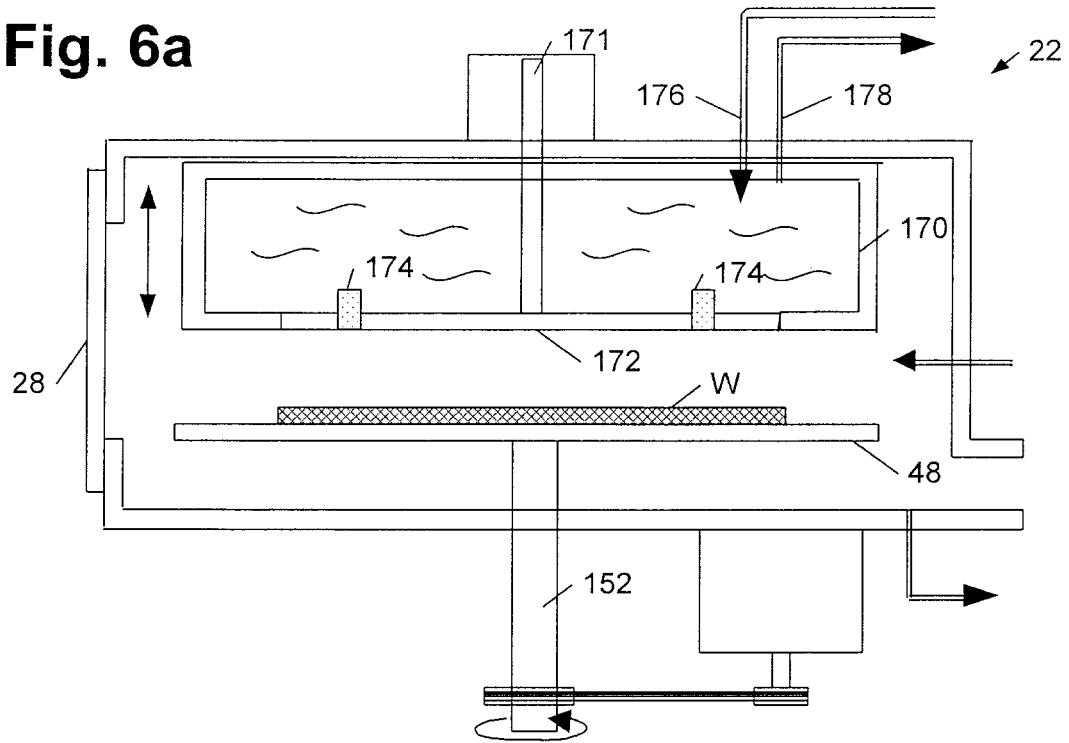
FIG. 6a depicts a partial cross-sectional view of a process chamber with a reservoir arranged above a substrate holder.

Substrate holder 48 is shown within process chamber 22 in FIG. 6a-6d to aid in describing the adaptations of the chamber. Such a substrate holder may be substantially similar to the substrate holder depicted in FIG. 1 and, therefore, may include similar components and adaptations of the holder as described above. As shown in FIG. 6a, process chamber 22 may include reservoir 170 arranged above substrate holder 48. Alternatively, reservoir 170 may be arranged below substrate holder 48. In such an embodiment, process chamber 22 may be adapted to have wafer W arranged "face down" for processing. In other words, substrate holder 48 may be adapted to holder wafer W in a manner such that the side of the wafer to be treated is facing reservoir 170. In yet another embodiment, reservoir 170 and substrate holder 48 may be oriented perpendicular to the arrangement shown in FIGS. 6a-6d. In particular, substrate holder 48 may be oriented such that the upper surface of the substrate holder is parallel with the sidewalls of process chamber 22. In this manner, wafer W may be arranged vertically within process chamber 22. In such an embodiment, reservoir 170 may be arranged to the right or left of substrate holder 48. Consequently, process chamber 22 may be adapted to move reservoir 170 in a horizontal direction in such a case.

In any case, reservoir 170 may be adapted to hold a fluid for processing a microelectronic topography. In some cases, the fluid may be a single phase fluid, such as a liquid or a gas. In other embodiments, however, reservoir 170 may be adapted to hold multi-phase fluids. In either case, process chamber 22 may be adapted to replenish the fluid within reservoir 170 such that fluid may retain its processing properties. For example, in some cases process chamber 22 may include inlet 176 and outlet 178 coupled to reservoir 170. In some embodiments, the fluid may be recycled through such an inlet and outlet. In any case, the replenishing of the fluid in reservoir 170 may be conducted prior to, during, or subsequent to a processing step of the chamber.

Figure 6B:
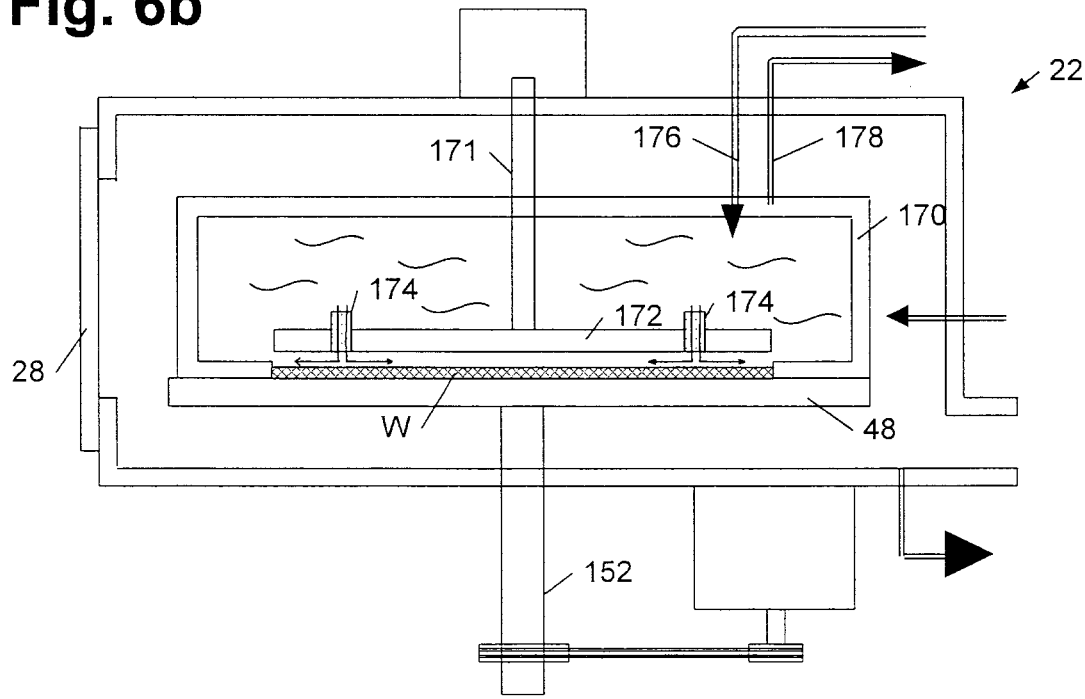
FIG. 6b depicts a partial cross-sectional view of the process chamber of FIG. 6a subsequent to lowering the reservoir toward the substrate holder.

In some embodiments, process chamber 22 may be adapted to move reservoir 170 relative to substrate holder 48 as noted by the bi-directional arrow in FIG. 6a. In particular, process chamber 22 may include moveable shaft 171 to which reservoir 170 is attached, or more specifically, hatch 172 of reservoir 170 is attached. In some embodiments, process chamber 22 may be adapted to position reservoir 170 in contact with substrate holder 48 as shown in FIG. 6b. In other embodiments, however, process chamber 22 may be adapted to position reservoir 170 upon a microelectronic topography residing on substrate holder 48. In either case, the adaptation of process chamber 22 to move reservoir 170 toward substrate holder 48 may allow an enclosed area to be formed about a portion of substrate holder 48, particularly in an area in which a microelectronic topography may be arranged. In this manner, process chamber 22 may be adapted to position reservoir 170 proximate to substrate holder 48 such that a fluid stored in reservoir 170 may be used to process a microelectronic topography arranged upon the substrate holder.

As shown in FIG. 6b, process chamber 22 may be further adapted to raise hatch 172 of reservoir 170 as well as open valves 174 of reservoir 170 upon positioning the reservoir proximate to substrate holder 48. Consequently, the transition between FIGS. 6a and 6b may illustrate the movement of reservoir 170 as a whole toward substrate holder 48 and FIG. 6b may illustrate the raising of hatch 172 and the opening of valves 174. In an alternative embodiment, hatch 172 may be adapted to open rather than be raised. In particular, hatch 172 may include a shutter window aligned with the region of substrate holder 48 upon which a wafer may be arranged. In any case, raising and/or opening hatch 172 may allow a microelectronic topography arranged upon substrate holder 48 to be exposed to fluid stored within reservoir 170, allowing treatment of the microelectronic topography to start. Opening valves 174 may additionally or alternatively serve to expose a wafer to a fluid stored within reservoir 170. In general, the treatment process conducted within process chamber 22 may include any process step of a fabrication sequence for a microelectronic device, including but not limited to etching, depositing, cleaning, activating, and/or drying. In some embodiments, the configuration of process chamber 22 may be particularly advantageous for an electroless deposition process.

In any case, hatch 172 may be formed from a polymer or any other material used in microelectronic fabrication for reservoirs. In some embodiments, hatch 172 may made of a permeable material, such as synthetic membranes, such that ions within the fluid of reservoir 170 may be distributed upon wafer W when hatch 172 is aligned with the base of reservoir 170. Such a configuration may be particularly advantageous for embodiments in which an electroless deposition process is conducted within process chamber 22. In some embodiments, hatch 172 may further include a polymer shutter window to prevent the distribution of ions through the permeable material for processes conducted prior to or subsequent to the electroless deposition process. In any case, hatch 172 may be configured to have a length (e.g. a diameter) which allows a substantial portion of a wafer arranged upon substrate holder 48 to be exposed to a fluid stored within reservoir 170. For example, in some cases, latch 172 may include a length which is substantially similar to the diameter of a wafer as shown in FIG. 6b. In other embodiments, however, latch 172 may have a length which is longer than the diameter of a wafer. In general, hatch 172 may have a plan view of any shape, including but not limited to circles and rectangles.

Prior to the raising hatch 172, the hatch may be detached from the sidewalls of reservoir 170 to allow the reservoir to remain proximate to substrate holder 48. In other cases, however, process chamber 22 may not be adapted to raise hatch 172 or hatch 172 may be omitted from reservoir 170. In such an embodiment, exposing fluid stored within reservoir 170 to a microelectronic topography arranged upon substrate holder 48 may be solely achieved by opening valves 174. In yet other embodiments, process chamber 22 may not be adapted to open valves or valves 174 may be omitted from reservoir 170. In such a case, exposing fluid stored within reservoir 170 to a microelectronic topography arranged upon substrate holder 48 may be solely achieved by raising hatch 172. Consequently, in some cases, process chamber 22 may be adapted to only raise hatch 172 or open valves 172. In addition, although FIGS. 6a-6d illustrate reservoir 170 including two valves, any number of valves may be included within reservoir 170. Consequently, process chamber 22 is not restricted to the configurations depicted in FIGS. 6a-6d.

Figure 6C:
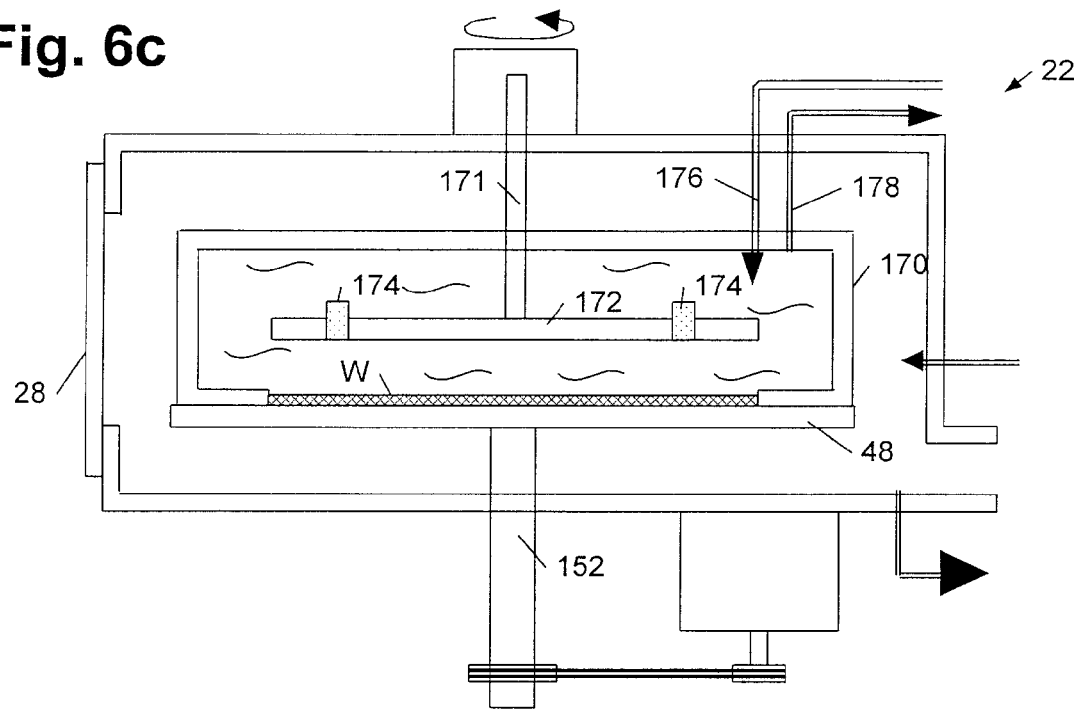
FIG. 6c depicts a partial cross-sectional view of the process chamber in which a hatch of the reservoir has been raised subsequent to the lowering of the reservoir in FIG. 6b.

As shown in FIG. 6c, process chamber 22 may be adapted to continue raising hatch 172. In general, hatch 172 may be raised to any position within reservoir 170. In some embodiments, it may be particularly advantageous to raise hatch 172 to a level mid-way within reservoir 170 when hatch 172 is used to mix and/or agitate the fluid within the reservoir. In this manner, hatch 172 may be sufficiently distanced from the chamber walls of reservoir 170. In other cases, however, hatch 172 may be raised to a level other than the mid-way position within reservoir 170 without disturbing the sidewalls of the reservoir. In any case, process chamber 22 may be adapted to agitate the fluid stored within reservoir 170. In particular, process chamber 22 may be adapted to cause a sufficient amount of motion within reservoir 170 to prevent the accumulation of bubbles upon the microelectronic topography. In some embodiments, the adaptation to agitate the fluid may include an adaptation to rotate hatch 172. More specifically, process chamber 22 may be adapted to turn shaft 171 such that hatch 172 attached thereto may be rotated. It is noted that other agitation mechanisms known in microelectronic fabrication or described herein may also or alternatively be used to agitate the fluid within reservoir 170, depending on the design specifications of the process chamber. In any case, the agitation of the fluid within reservoir 170 may be conducted during or subsequent to raising hatch 172.

Figure 6D:
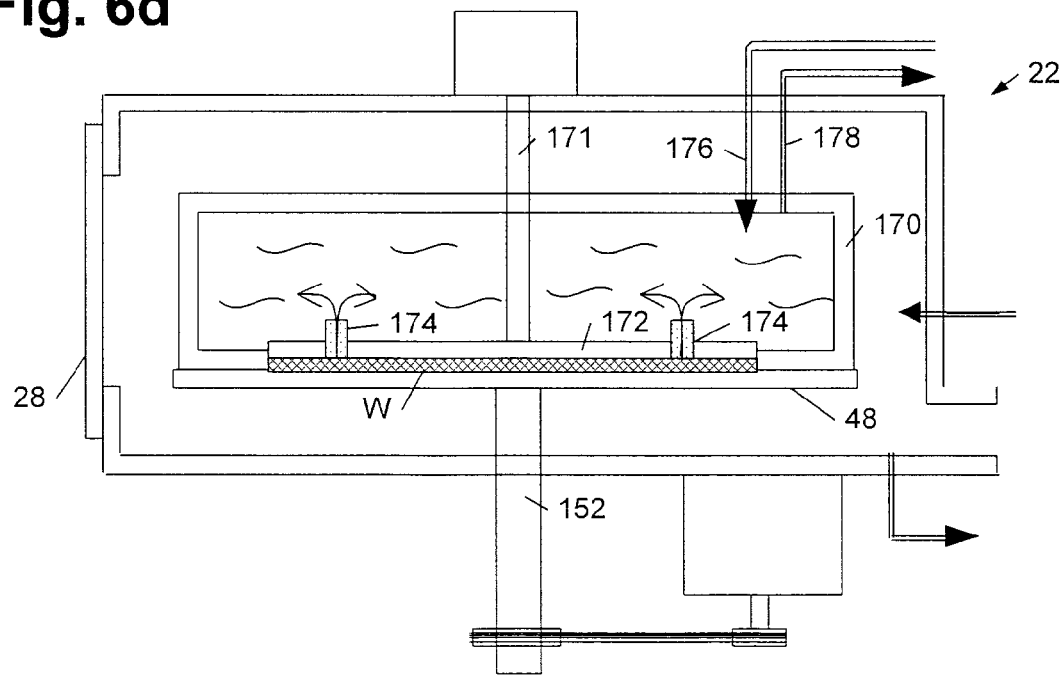
FIG. 6d depicts a partial cross-sectional view of the process chamber in which the hatch of the reservoir has been lowered back down to the base of the reservoir subsequent to the raising of the hatch in FIG. 6c.

Upon completion of the fabrication process step, hatch 172 may be lowered back down to be in alignment with the base of reservoir 170 as shown in FIG. 6d. In particular, process chamber 22 may be adapted to move shaft 171 such that hatch 172 is proximate to substrate holder 48. Upon lowering hatch 172, fluid may be forced back through valves 174 as shown in FIG. 6d. In this manner, reservoir 170 may retain the process fluid used to treat the microelectronic topography. Subsequent to lowering hatch 172 to be in alignment with the base of reservoir 170, hatch 172 may be coupled to the base and reservoir 170 may be raised to a level spaced above substrate holder 48. In this manner, the wafer arranged upon substrate holder 48 may be removed from process chamber 22 and a new wafer may be loaded therein.

Returning to FIG. 1, system 20 may include auxiliary equipment to further enhance the introduction of fluids to process chamber 22. For example, in some embodiments, system 20 may be adapted to control the flow rate and time at which a fluid is supplied to process chamber 22. As such, supply lines 74, 75, 76a, 76b, 76c, 78 and 80 may include solenoid valves in some cases. Operation of the solenoid valves as well as other components within system 20 may be controlled through central processing unit (CPU) 106 as described in more detail below. In some embodiments, system 20 may include heaters, coolers, and thermocouples for regulating the temperature of a fluid introduced into process chamber 22. In fact, it may be particularly advantageous to regulate the temperature of a solution used for an electroless deposition process. Typically, the deposition rate of an electrolessly deposited material increases with increases in temperature. Some electroless deposition solutions, however, tend to decompose at or near their boiling point, causing a material to be non-uniformly deposited or not deposited at all. As such, supply line 74 may, in some embodiments, include temperature control unit 86, which is adapted to heat and monitor the temperature of the solution routed for reservoir 70. In some cases, process chamber 22 may further include temperature sensor 87 installed in solution return line 88 and communicably coupled to temperature control unit 86. In yet other cases, reservoir 70 and/or supply line 75 may additionally or alternatively include a temperature sensor or a temperature control unit.

In general, the temperature of an electroless deposition solution during processing may be between approximately 16° C. and approximately 120° C. However, in some cases, an electroless deposition solution may be maintained at a temperature, which is approximately 25% or less below its boiling temperature. Maintaining an electroless deposition solution at such a temperature may maximize the deposition rate of the process in some embodiments. In yet other embodiments, an electroless deposition solution may be maintained at room temperature in order to maximize the uniformity of the deposition. It is noted that although the aforementioned temperature controls are discussed in reference to monitoring and heating a supply line or tank for an electroless deposition solution, the control devices may be used for regulating the temperature of any fluid introduced into process chamber 22. As such, process chamber 22 may, in some embodiments, additionally or alternatively include temperature control devices within auxiliary tanks 72a, 72b, 72c and/or supply lines 76a, 76b, 76c, 78, 80.

In some embodiments, system 20 may additionally or alternatively be adapted to heat and/or cool substrate holder 48. Such an adaptation may be particularly advantageous for improving the deposition rate and uniformity of an electroless deposition process. For example, heating substrate holder 48 and, thus, the wafer residing thereon, during a deposition process may advantageously increase the deposition rate of a process. In such an embodiment, the relatively high deposition rate may be realized while the electroless deposition solution is supplied to process chamber 22 at a relatively low temperature, preventing the solution from decomposing. In addition, an adaptation to cool a substrate may offer a manner with which to immediately terminate a deposition process and, thus, allow for more control over the amount deposited upon the substrate. For an efficient deposition of metals from an electroless deposition solution, the temperature on the surface of the wafer supported upon substrate holder 48 may be maintained between approximately 16° C. and approximately 120° C. Larger or smaller substrate temperatures, however, may be used, depending on the material to be deposited.

In some embodiments, the adaptation to heat and/or cool a wafer may be incorporated within substrate holder 48. In particular, an electric heater and/or a circulation-fluid cooler may be built into the body of substrate holder 48. In yet other embodiments, substrate holder 48 may include a Peltier-type cooler/heater which is adapted to serve the dual roles of heating and cooling the substrate holder. In particular, the Peltier-type cooler/heater may include a package of two semiconductor plates that operate on the principle of generating heat when current flows in one direction and absorbing heat when current flows in the opposite direction. Descriptions and illustrations of mechanisms used to heat and/or cool a substrate holder may be found in U.S. patent application Ser. No. 10/242,331 and is incorporated by reference as if fully set forth herein.

As noted above, the components lining chamber walls 23, cover 24, and base 25 may be adapted to hermetically seal process chamber. Consequently, process chamber 22 may be pressurized in some embodiments. In some cases, it may be advantageous to regulate the pressure within process chamber 22 and, therefore, in some embodiments, process chamber 22 may include pressure sensor 89. Although pressure sensor 89 is shown arranged within supply line 80 in FIG. 1, pressure sensor 89 may be located within any other supply line of system 20 or within process chamber 22. In some embodiments, it may be advantageous to pressurize process chamber 22 to a predetermined value through the use of supply lines 74, 75, 76a, 76b, 76c, 78, 80, and/or outlets of the process chamber. In particular, it may be advantageous to pressurize process chamber 22 to a level, such as between approximately 5 psi and approximately 100 psi, or more specifically, to approximately 50 psi. Larger or smaller values of pressure may be generated within process chamber 22, however, depending on the process parameters of the device being fabricated and the operational parameters of system 20. In general, increasing the pressure within process chamber 22 may increase the boiling point of the fluids supplied to the chamber during processing of a wafer in the chamber. As noted above, the deposition rate of an electroless deposition solution typically increases with increases in temperature, but tends to decompose at or near its boiling point, causing a material to be non-uniformly deposited or not deposited at all. As such, increasing the pressure within process chamber 22 may advantageously allow a material to be deposited faster and, in some cases, more uniformly.

In addition to increasing the boiling point of a processing fluid, increasing the pressure within process chamber 22 may advantageously minimize the generation of bubbles upon a wafer during processing. In particular, increasing the pressure within process chamber 22 may decrease the generation of hydrogen atoms within the reaction of the electroless deposition process, thereby decreasing the number of bubbles to accumulate upon the wafer being processed within the chamber. As noted above, the accumulation of bubbles upon a wafer surface during processing may undesirably cause a microelectronic topography to be processed non-uniformly, potentially producing device features with dimensions out of the design specification of the device. In some cases, a microelectronic topography may be wetted with a fluid comprising a surfactant prior to exposing the topography to the fluids with which to process the topography to reduce the accumulation of bubbles on the surface of the topography. For example, a microelectronic topography may be wetted with a fluid comprising polyethylene glycol such that unwettable portions of the topography may be transposed into portions adapted to be wetted by subsequent processing fluids. Increasing the wettability of the microelectronic surface may advantageously reduce the generation and accumulation of bubbles upon the microelectronic topography during processing.

Another manner with which to minimize the accumulation bubbles on a wafer during processing is to agitate the fluid used to process the wafer. Consequently, in some embodiments, process chamber 22 may include a means with which to agitate fluids supplied to the chamber. For example, process chamber 22 may include means 90 arranged within process chamber 22 as shown in FIG. 1. In particular, means 90 may be arranged at a level above substrate holder 48. Alternatively, means 90 may be arranged at a level below substrate holder 48. In yet other embodiments, means 90 may be coupled to substrate holder 48. In some cases, means 90 may include a transducer adapted to provide acoustic waves to a fluid used to process a wafer within the chamber. For example, the transducer may be adapted to provide ultrasonic or megasonic waves. In either case, the transducer may be arranged such that the acoustic waves are propagated parallel or perpendicular to a treating surface of the wafer. In yet other embodiments, the transducer may be arranged such that the acoustic waves are propagated at an angle between approximately 0° and approximately 90° relative to a treating surface of the wafer. The "treating surface" of a wafer, as used herein, may refer to the surface of the wafer at which fluids are introduced to fabricate features upon the wafer. Although means 90 is shown arranged within process chamber 22 in FIG. 1, process chamber 22 may additionally or alternatively include a transducer within any of the supply lines coupled to process chamber 22. In yet other embodiments, process chamber 22 may not include a transducer with which to provide acoustic waves.

In any case, means 90 may, in some embodiments, additionally or alternatively include a device configured to move across an enclosed region of process chamber 22. More specifically, means 90 may include a device configured to move across the region directly above substrate holder 48. In this manner, the device may be configured to move across a wafer being processed within process chamber 22. In some embodiments, the device may be configured to come into contact with the wafer. In other embodiments, however, the device may be configured to not come into contact with the wafer. In particular, the device may be configured to traverse the enclosed region at a level spaced above the wafer when contact with the device may cause damage to the wafer. In some embodiments, the device may be configured to distribute one or more fluids toward substrate holder 48 such that a wafer may be processed. In this manner, the device may serve as a fluid inlet to process chamber 22. In some cases, it may be particularly advantageous for the device to deliver fluids at a rate sufficient to eliminate the "loading effect" during processing. The "loading effect," as used herein, may refer to the higher rate of consumption of active components within a fluid in high density areas of a wafer as compared to the rate of consumption in areas with a lower density of features. For example, sulfuric acid may be consumed faster in a region comprising a high density of copper interconnects as compared to a region of a wafer comprising a few or no copper interconnects. In yet other cases, the device may not be adapted to dispense a fluid, but rather, may simply be used to agitate the fluid above substrate holder 48.

In any case, the device may include any mechanism which may cause a sufficient amount of agitation with which to remove and/or prevent the accumulation of bubbles on the surface of the underlying wafer. In a preferred embodiment, the adaptation to agitate may be sufficient to cause laminar agitation rather than turbulent agitation. Turbulent agitation may undesirably cause processing to be non-uniform across a wafer, while laminar agitation may be sufficient to remove and/or prevent the accumulation of bubbles on the wafer surface and not affect the uniformity of the process. As noted above, the device may be configured to dispense one or more fluids. Such an adaptation may be used to agitate the fluid above substrate holder 48 in some embodiments. Other manners for agitating the fluid, however, may additionally or alternatively be used. For example, in some embodiments, the device may include a brush with a plurality of bristles to stir the fluid within process chamber 22. Alternatively, the device may simply include a single rod, block, or plate. In some embodiments, the device may include a propeller. In this manner, a high fluid flow rate may be induced about the substrate surface without utilizing a complex system of high pressure pumps and tubing. Consequently, it is noted that the device may include any design and may traverse at any speed sufficient to cause a disturbance with which to minimize the number of bubbles on a wafer surface. In yet other cases, however, process chamber 22 may not include such a device.

Regardless of whether means 90 includes the aforementioned device or a transducer, means 90 may offer a means of agitating a fluid within process chamber 22 that is distinct from the inlets used to supply the fluid. As will be described in more detail below, fluids may be introduced into process chamber 22 through either shower element 92, dispense arm 94, or any other inlet ports coupled to supply lines 74, 75, 76*a*, 76*b*, 76*c*, 78, and/or 80. As such, means 90 may offer a manner with which to agitate process fluids which are independent from shower element 92, dispense arm 94, and/or any other inlet ports coupled to supply lines 74, 75, 76*a*, 76*b*, 76*c*, 78, and/or 80. In some embodiments, however, process chamber 22 may not include means 90.

In any case, shower element 92, dispense arm 94, and/or the inlet ports coupled to supply lines 74, 75, 76*a*, 76*b*, 76*c*, 78, and/or 80 may additionally or alternatively serve to agitate a process fluid arranged within process chamber 22. More specifically, shower element 92, dispense arm 94, and/or the inlet ports coupled to supply lines 74, 75, 76*a*, 76*b*, 76*c*, 78, and/or 80 may, in some embodiments, be adapted to introduce a fluid into process chamber 22 at a sufficient rate with which to agitate the fluid within the chamber. For example, in some embodiments, shower element 92, dispense arm 94, and/or the inlet ports coupled to supply lines 74, 75, 76*a*, 76*b*, 76*c*, 78, and/or 80 may be adapted to introduce a fluid at a rate between approximately 0.01 gallons per minute (gpm) and approximately 10 gpm, or more specifically, between approximately 0.1 gpm and approximately 10 gpm. However, larger or smaller flow rates may be used, depending on the process parameters of the device being fabricated and the operational parameters of system 20. In addition or alternatively, shower element 92, dispense arm 94, and/or the inlet ports coupled to supply lines 74, 75, 76*a*, 76*b*, 76*c*, 78, and/or 80 may be adapted to pulse the introduction of a fluid into process chamber 22. Such a pulsation may be at a frequency between approximately 0.1 Hz and approximately 10 Hz, or more specifically, between approximately 1.0 Hz and approximately 10 Hz. Larger or smaller frequencies may be used, however, depending on the process parameters of the device being fabricated and the operational parameters of system 20.

Regardless of the method used to agitate a fluid within process chamber 22, the motion created within process chamber 22 is preferably sufficient to minimize the generation and/or accumulation of bubbles on a wafer surface. As noted above, reducing the number of bubbles upon a wafer surface during treatment of the wafer may significantly improve the uniformity of the treatment on the wafer surface. Consequently, the process of agitating a fluid may result in a wafer feature having substantially uniform dimensions. For example, a deposition solution used to deposit a layer upon a wafer may be agitated to create an amount of motion sufficient to form a layer having substantially uniform thickness across the wafer. Since an electroless deposited material may be particularly susceptible to non-uniformity with the presence of bubbles, process chamber 22 may, in some cases, be specifically adapted to agitate a deposition solution supplied to the chamber. In particular, means 90, shower element 92, dispense arm 94, and/or the inlet ports coupled to supply lines 74, 75, 76*a*, 76*b*, 76*c*, 78, and/or 80 may be programmed to use their agitation adaptations when a deposition solution is being introduced into process chamber 22. In some cases, means 90, shower element 92, dispense arm 94, and/or the inlet ports coupled to supply lines 74, 75, 76*a*, 76*b*, 76*c*, 78, and/or 80 may be adapted to agitate other solutions associated with the fabrication of a microelectronic device as well.

Figure 7:
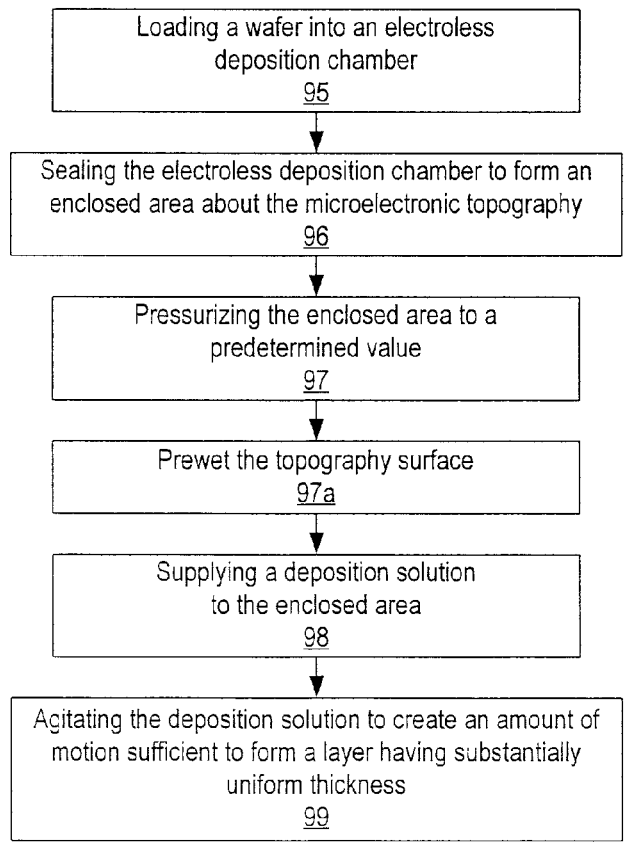
FIG. 7 depicts a flow chart for minimizing the generation of bubbles upon a wafer surface during processing.

Consequently, a method for minimizing the accumulation of bubbles upon a wafer during an electroless deposition process is provided herein. Such a method is depicted in FIG. 7 and may include any or all of the process parameters listed for the components used to agitate a fluid within process chamber 22 as described above. As shown in FIG. 7, the method may include step 95 in which a wafer is loaded into an electroless deposition chamber. In some embodiments, the wafer may be loaded such that the wafer is face-up in the electroless deposition chamber. In general, "face-up," as used herein, may refer to the orientation of a wafer having a surface to be treated facing upward, or more specifically, facing the top of a chamber. In turn, "face-down," as used herein, may refer to the orientation of a wafer having a surface to be treated facing downward, or more specifically, facing the bottom of a chamber. Such an orientation may advantageously reduce the accumulation of bubbles upon the wafer surface. The method depicted in FIG. 7 is not, however, restricted to loading a wafer in such an orientation. As such, in other embodiments, the method may include loading the wafer face-down. In such an embodiment, the process steps of pressurizing the chamber and/or agitating the process fluid, as described in more detail below, may serve to minimize the generation and accumulation of bubbles on the wafer surface.

In any case, the method may further include sealing the electroless deposition chamber to form an enclosed area about the wafer as shown in step 96. As noted above, such a sealing process may serve to pressurize a chamber. In some embodiments, however, the method may include pressurizing the enclosed area to a predetermined value as noted in step 97. Such a predetermined value may be between approximately 5 psi and approximately 100 psi, or more specifically, approximately 50 psi. Larger or smaller pressures may be generated, however, depending on the process parameters of the device being fabricated and the operational parameters of system 20. In general, pressurizing the chamber to such values may be accomplished by introducing fluids into the chamber and restricting flow from the outlets of the chamber.

As noted above, pressurizing the chamber may advantageously reduce the generation and accumulation of bubbles on a wafer surface during processing. As such, the steps of agitating the deposition solution and pressurizing the chamber may collectively reduce the amount of bubbles formed upon the wafer during the electroless deposition process. In embodiments in which the wafer is loaded face-up, the method may collectively offer three manners with which to reduce the amount of bubbles formed upon the wafer during the electroless deposition process. In yet other embodiments, step 97 may be omitted from the method depicted in FIG. 7. In such an embodiment, the step of agitating may exclusively serve to minimize the generation and accumulation of bubbles upon a wafer surface or may collectively serve such a function when the wafer loaded face-up and/or the wafer is prewetted as described in reference to step 97*a*.

As shown in FIG. 7, the method may, in some embodiments, include step 97*a* in which the wafer is prewetted. Such a step may include introducing a substantially neutral solution to the wafer such that dry spots or areas with surface irregularities may be wetted to prevent the formation of bubbles at such locations. In yet other embodiments, step 97a may be omitted from the method. In any case, the method may further include supplying a deposition solution to the enclosed area and agitating the deposition solution as shown in steps 98 and 99, respectively. As noted above, agitating step 99 preferably includes creating a sufficient amount of motion such that a layer having a substantially uniform thickness may be fabricated. Such a step may include using any of the means for agitating a solution described above, including exposing the deposition solution to acoustic waves, moving a device above and across a wafer, and/or distributing fluid continuously or in a pulsing sequence through any of the fluid inlets coupled to the chamber.

As noted above, fluids may be supplied to process chamber 22 through shower element 92, dispense arm 94, means 90 and/or any of the inlet ports coupled to supply 74, 75, 76a, 76b, 76c, 78, and/or 80. The fluids may include those used for any fabrication process of a microelectronic topography, including processes used for depositing, etching, cleaning, polishing, and/or drying a topography. In some embodiments, the fluids may be further used to clean and/or dry the interior of process chamber 22. In particular, the inlet ports of process chamber 22 may be adapted to distribute fluids such that the interior surfaces of dry cover 24, sidewalls 23, and base 25 may be cleaned and/or dried. In some cases, the chamber walls may be cleaned and/or dried while a topography arranged upon substrate holder 48 is cleaned and/or dried, reducing production down time to clean the chamber. In any case, the fluid inlets of process chamber 22 may be adapted to supply one or more fluids to the process chamber. In particular, the fluid inlets may be adapted to supply fluids simultaneously or sequentially into process chamber 22.

In general, shower element 92 may be adapted to dispense a fluid as a spray extending across nearly the entire wafer. In this manner, the fluid may be dispensed across the entire wafer. As shown in FIG. 1, shower element 92 may be centrally positioned above substrate holder 48. Such a position of shower element 92 along with rotation of substrate holder 48 may insure a uniform distribution of fluid across a wafer, although a fluid can be uniformly distributed with shower element 92 in other locations as well. As such, process chamber 22 is not restricted to having shower element 92 in the location depicted in FIG. 1. In particular, shower element 92 may be alternatively positioned at other locations within process chamber 22. "Spray," as used herein, may refer to a stream of finely divided streams, particles, or droplets. As such, shower element 92 may include one or more nozzles adapted to distribute a fluid at a high enough pressure such that a spray is generated. In addition or alternatively, shower element 92 may include a disc upon which fluid is introduced and distributed over the sides. In either case, shower element 92 may be alternatively adapted to distribute a fluid such that its stream is not divided into separate streams or droplets.

As noted above, process chamber 22 may further or alternatively include dispensing arm 94. FIG. 1 shows dispensing arm 94 extending above a portion of substrate holder 48. In other embodiments, however, dispensing arm 94 may extend across the entire wafer. In either case, the fluid introduced through dispensing arm 94 may be uniformly distributed across a wafer by rotating the wafer. In yet other embodiments, dispensing arm 94 may be configured to distribute across an entirety of a wafer without rotating the wafer. In yet other cases, dispensing arm 94 may be configured to distribute a fluid upon a portion of the wafer. In any case, dispensing arm 94 may include one or more outlets with which to distribute a fluid across a wafer. In particular, dispensing arm 94 may include a plurality of outlets spaced along the arm and directed toward substrate holder 48. Alternatively, dispensing arm 94 may include a single outlet, near the end of the arm extending above substrate holder 48, for example. In either case, the outlets within dispensing arm 94 may, in some embodiments, include nozzles such that a fluid may be introduced as a spray from the arm. In yet other embodiments, the outlets may include openings which allow the fluid to be introduced upon a wafer in a non-spray manner.

In some cases, dispensing arm 94 may be configured to move. More specifically, dispensing arm 94 may be configured to move from a position above substrate holder 48 to a location adjacent to the substrate holder. For example, one end of dispensing arm 94 may be connected to a respective rotary drive mechanism arranged adjacent to substrate holder 48 such that the arm may pivot at such a location. Such an adaptation may allow the wafer to be more easily loaded into process chamber 22. More specifically, the moveable adaptation of dispensing arm 94 may allow a wafer to be loaded into process chamber 22 without being damaged. In addition, such a moveable adaptation may allow dispensing arm 94 to deliver a fluid to a specific area of the wafer, thereby providing variable exposure of a process fluid to the wafer.

In some embodiments, shower element 92 may be used to distribute a deposition solution, while dispensing arm 94 may be used to distribute fluids for processes prior to or subsequent to a deposition process. For example, in some cases, dispensing arm 94 may be used to distribute fluids for activation, cleaning, rinsing and/or drying a wafer. The process chamber described herein, however, is not restricted to such a configuration. In particular, shower element 92 and dispensing arm 94 may be used to distribute any fluid for any process used to fabricate a microelectronic device. In addition, shower element 92 and dispensing arm 94 may be used to distribute fluids for the same process and, therefore, may distribute fluids simultaneously in some cases. Furthermore, one or both of shower element 92 and dispensing arm 94 may be used for distributing fluids for all processes conducted in process chamber 22. In some cases, fluids may be supplied to process chamber 22 by inlets other than by shower element 92 and dispensing arm 94. In particular, fluids may be supplied to process chamber 22 by any inlet coupled to a fluid supply line. In general, the inlets may be positioned at any location within process chamber 22. For example, process chamber 22 may include, in some embodiments, fluid inlets arranged along the sidewall 23 or base 25 of the process chamber. In this manner, process chamber 22 may be adapted to introduce fluids above a wafer, from below a wafer, or in between wafers when multiple wafers are processed within the process chamber.

In some embodiments, process chamber 22 may include fluid inlet 100 positioned below substrate holder 48 as shown in FIG. 1. In some cases, inlet 100 may be configured such that fluid from the inlet is projected onto the wafer. More specifically, inlet 100 may be configured to direct fluid toward a region just above substrate holder 48, such that the fluid is indirectly projected onto the wafer. An "indirect projection of fluid," as used herein, may refer to a projection of fluid which is not cast in a straight line toward its target. The target in process chamber 22, for example, may be a wafer arranged upon substrate holder 48. In general, the adaptation of inlet 100 to indirectly project a fluid toward substrate holder 48 may include positioning the inlet to project the fluid at an angle less than 90° and greater than 0° with respect to chamber wall 23. In addition, the flow rate of the fluid is preferably high enough to project the fluid above substrate holder 48. In some cases, a fluid may be projected from inlet 100 at a flow rate sufficient to have the crest of the projection between cover 24 and substrate holder 48. In this manner, the fluid may be distributed upon a wafer arranged upon the substrate holder 48. In other embodiments, however, a fluid may be projected from inlet 100 at a flow rate sufficient to hit cover 24 and reflect down to a wafer arranged upon substrate holder 48.

In either case, the flow rate and angle at which the fluid is projected from inlet 100 may be configured to distribute the fluid in a specific area of the wafer. For example, in some cases, the flow rate and angle at which the fluid is projected from inlet 100 may be configured to dispense the fluid along the edge of the wafer, the center of the wafer, or any other specific location of the wafer. In some embodiments, system 20 may be adapted to adjust the flow rate and angle at which the fluid is projected from inlet 100 such that the locations the fluid is dispensed varies. In this manner, the fluid may be uniformly distributed across the wafer. In other embodiments, system 20 may additionally or alternatively include a plurality of fluid inlets spatially arranged around substrate holder 48 such that the fluid is distributed uniformly across the wafer. An example of such a configuration of inlets is described in more detail below in reference to FIGS. 8a and 8b. In yet other cases, system 20 may be additionally or alternatively adapted to rotate a wafer such that the fluid may be evenly distributed across the wafer. Alternatively, however, system 20 may not be adapted to rotate a wafer.

Although inlet 100 is described as being positioned below substrate holder 48, inlet 100 is not restricted to such a location. On the contrary, inlet 100 may be positioned at any location within process chamber 22. In this manner, process chamber 22 may include other inlets which are adapted to indirectly project a fluid upon a wafer, independent of where they are located within process chamber 22. In yet other embodiments, inlet 100 may not be configured to indirectly project a fluid upon a wafer. Rather, inlet 100 may simply be used to introduce a fluid to the enclosed area of process chamber 22. Such a configuration may be particularly advantageous in embodiments in which a bath of solution is maintained with process chamber 22 during processing.

Figure 8A:
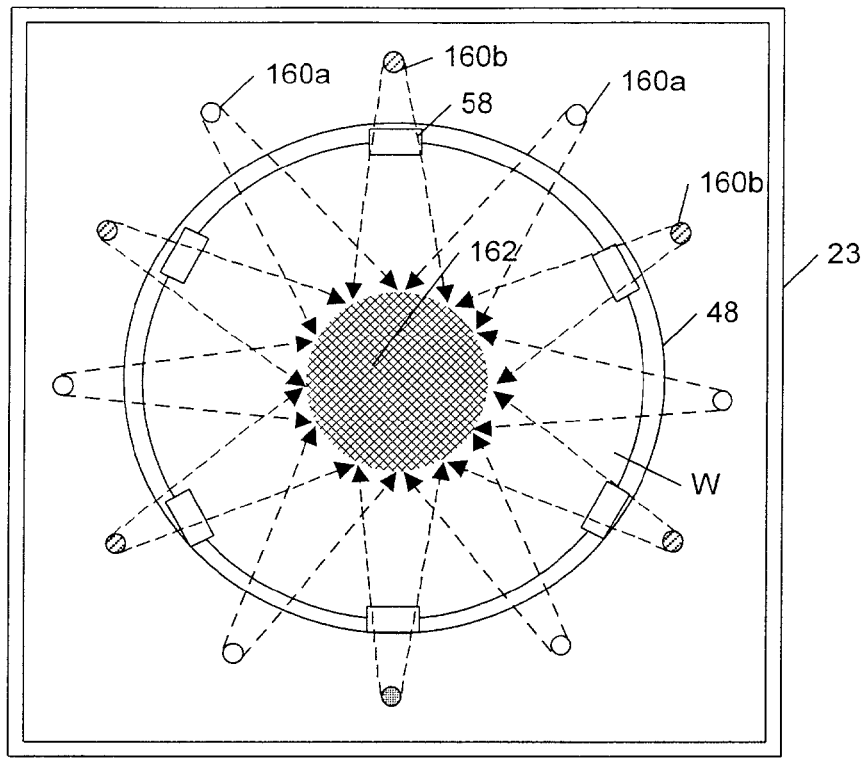
FIG. 8a depicts a top view of a process chamber included within the system depicted in FIG. 1 having a plurality of inlets spatially arranged about a substrate holder.
Figure 8B:
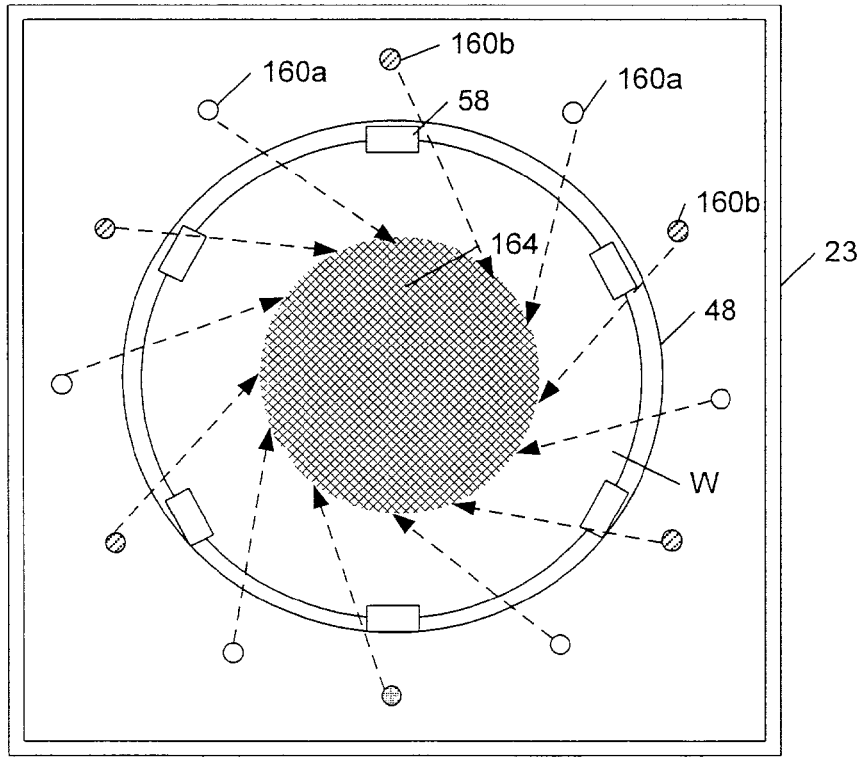
FIG. 8b depicts a top view of the plurality of spatially arranged inlets of FIG. 8a configured to project fluid in a different direction.

Turning to FIGS. 8a and 8b, an exemplary arrangement of inlets with which to supply one or more fluids to process chamber 22 is shown. In particular, FIGS. 8a and 8b show a top view of process chamber 22 taken along line AA in FIG. 1 with wafer W is secured to substrate holder 48 via clamping jaw 58. As shown in FIGS. 8a and 8b, process chamber 22 may, in some embodiments, include a plurality of inlets 160a and 160b configured to distribute one or more fluids into the process chamber. In some cases, the distribution of fluids from inlets 160a and 160b may be projected to central portion 162 of wafer W as shown by the dotted lines in FIG. 8a. Alternatively, the distribution of fluids from inlets 160a and 160b may be projected to a different or a plurality of different portions of wafer W. For example, fluids may be projected at an angle from inlets 160a and 160b to distribute the fluids to portion 164 of wafer W as shown in FIG. 8b. Such an adaptation may advantageously allow fluids to be distributed to a larger surface area of wafer W from inlets 160a and 160b. In some cases, system 20 may be adapted to adjust the angle and flow rate of a fluid through inlets 160a and 160b such that the distribution of fluids across wafer W may vary. As a result, the distribution of fluids across wafer W may be adapted to be substantially uniform in some embodiments. As noted above, substrate holder 48 may be additionally adapted to rotate to further enhance the distribution of fluids across wafer W.

In general, inlets 160a and 160b may be arranged about substrate holder 48 such that the one or more fluids may be dispensed upon wafer W. For example, inlets 160a and 160b may be arranged circumferentially around substrate holder 48. In some embodiments, the arrangement of inlets 160a and 160b may be uniform as shown in FIG. 7. In other embodiments, however, the arrangement of inlets 160a and 160b may be not be uniform. In either case, inlets 160a and 160b may be arranged below, above, and/or at the approximately the same level as the upper surface of substrate holder 48. In this manner, inlets 160a and 160b may, in some embodiments, include a similar configuration as inlet 100. In yet other embodiments, inlets 160a and 160b may be configured to project one or more fluids directly upon wafer W.

In some cases, system 20 may be adapted to introduce different fluids into process chamber 22 through inlets 160a and 160b, respectively. In this manner, mixing fluids into a solution may be averted until the fluids are on the wafer. Such an adaptation may be particularly advantageous when using deposition solutions that quickly decompose. For example, the deposition of copper using electroless techniques sometimes includes mixing a reducing agent and with a metal ion solution. The mixture of the fluids tends to quickly decompose, limiting the deposition efficiency of the solution. As a consequence, the deposition solution may need to be replenished often, if not continuously. The adaptation of including plurality of inlets 160a and 160b may advantageously allow the fluids to mix at the surface of the wafer, increasing the life of the deposition solution. As a result, fluid consumption may be reduced, decreasing the overall process costs of fabricating a device with such a layer.

As shown in FIGS. 8a and 8b, inlets 160a and 160b may be alternatively spaced about substrate holder 48. Such an arrangement may advantageously reduce the amount of interaction between two fluids of a solution before combining them at the surface of a wafer. In other embodiments, however, limiting the interaction of two fluids before combining them at the surface of a wafer may be accomplished by arranging inlets 160a circumferentially along one side of substrate holder 48 and inlets 160b circumferentially along the other side of substrate holder 48. It is understood that other arrangements of inlets 160a and 160b used to minimize the interaction of fluids before being combined at the surface of a wafer may be included within process chamber 22 as well.

In general, fluids supplied to process chamber 22 and used to process a wafer residing upon substrate holder 48 may be removed through exhaust ports of the chamber. For example, process fluids may be removed through outlets 88 and/or 102. Although outlets 88 and 102 are shown arranged along the bottom of process chamber 22, the outlets may be arranged along other portions of process chamber 22 as well or alternatively. In addition, process chamber 22 is not restricted to having two outlet ports. On the contrary, process chamber 22 may include any number of outlet ports. In some embodiments, the outlet ports may discharge the fluids to a waste stream to be disposed. In other embodiments, however, one or more of the outlet ports may serve to recycle the process fluid back to its respective storage tank. For example, outlet 88 may serve to return an electroless deposition solution back to reservoir 70. In this manner, the deposition solution may be reused such that material and disposal costs may be minimized. In some cases, outlet 88 may include filter 103 such that reservoir 70 is not contaminated with particles removed from process chamber 22.

Since the elemental composition of a process fluid may directly affect the reaction rate and uniformity of treating a microelectronic topography, process fluids may need to be analyzed and adjusted prior to being supplied to process chamber 22. As such, system 20 may include analytical test equipment 104 for monitoring fluids used within process chamber 22. In general, analytical test equipment 104 may be used measure the concentration of elements within the process fluid. In this manner, it can be determined whether the process fluid is in specification or if the process fluid needs to be adjusted. The inclusion of analytical test equipment 104 may be particularly advantageous when system is configured to recycle one or more fluids back to their storage tanks In general, processing a wafer may consume some of the elements contained within the fluid used to process the wafer. Consequently, it may be advantageous to be able to monitor the concentration of elements with a process fluid such that the fluid may have the proper composition prior to being supplied to process chamber 22. In any case, analytical test equipment 104 may, in some embodiments, be coupled to supply line 75, as shown in FIG. 1, such that the process fluid may be analyzed directly before being supplied to process chamber 22. In yet other embodiments, analytical test equipment 104 may be additionally or alternatively coupled to supply line 75, reservoir 70, and/or outlet 88.

In general, analytical test equipment 104 may be adapted to measure the concentration of one or more elements. In some embodiments, however, it may be advantageous to have analytical test equipment 104 adapted to analyze four or more components. For example, embodiments in which process chamber 22 is used for a plurality of processes, such as the processes conducted prior to, during, and/or subsequent to an electroless deposition process, the adaptation of being able to measure the concentration of at least four components may be advantageous since the fluids used for the different process steps may have different compositions. In yet other embodiments, it may be advantageous to employ analytical test equipment with such an adaptation for processes which use solutions with a plurality of components. An exemplary process using a solution with at least four components is described in more detail below in reference to FIG. 12 in which a four-element barrier layer is deposited. In such an embodiment, it may be particularly advantageous for analytical test equipment 104 to be configured to measure the concentration of at least four components selected from the group consisting of boron compounds, chromium, cobalt, molybdenum, nickel, phosphorus compounds, rhenium, and tungsten.

Regardless of the number of components analytical test equipment 104 is adapted to analyze, system 20 may further include lines with which to adjust the composition of a process fluid. Such lines may be coupled to supply lines 74 and 75, reservoir 70, and/or outlets 88 and 102. In some embodiments, analytical test equipment 104 may be adapted to analyze the amount of hazardous components discharged from process chamber 22 through outlet 102. In this manner, the amount of agent needed to neutralize the hazardous components after being discharged may be optimized.

In some embodiments, control of system 20 and its components may be executed through central processing unit (CPU) 106. For instance, CPU 106 may include a carrier medium with program instructions for managing the use of solenoid valves on supply lines supply 74, 75, 76a, 76b, 76c, 78, 80 and/or outlets 88 and/or 102 such that fluids may be introduced and/or discharged for a predetermined sequence and, in some cases, for a predetermined amount of time. For example, upon completion of an electroless deposition process, CPU 106 may include program instruction with which to discontinue the supply of fluid from supply lines 74 and 75. Subsequently, CPU 106 may send a command to supply deionized water, for example, from supply line 78, or the supply of another treatment or neutralization solution. In some cases, CPU 106 may also send commands to regulate the flow of fluid through the outlet ports of process chamber 22 in between or during the discontinuation and supply commands of the inlet ports.

In any case, CPU 106 may further include program instructions for controlling the pressure within process chamber 22 as well as the temperature of substrate holder 48 and fluids introduced into process chamber 22. In some cases, CPU 106 may further include program instructions for monitoring concentrations of solution elements within supply lines supply 74, 75, 76a, 76b, 76c, 78, 80, reservoir 70, and/or solution feed back line 88. In such an embodiment, CPU 106 may include program instructions for adjusting compositions of the solution elements based upon the analysis performed by analytical test equipment 104. In order for CPU 106 to control the components of system 20, CPU 106 may be coupled to the components. Such individual connections to the components, however, are not illustrated FIG. 1 to simplify the illustration of the system. Rather, CPU 106 is shown coupled to process chamber 22 by a dotted line to show a general connection to the chamber and the other components included within system 20.

Figure 9A:
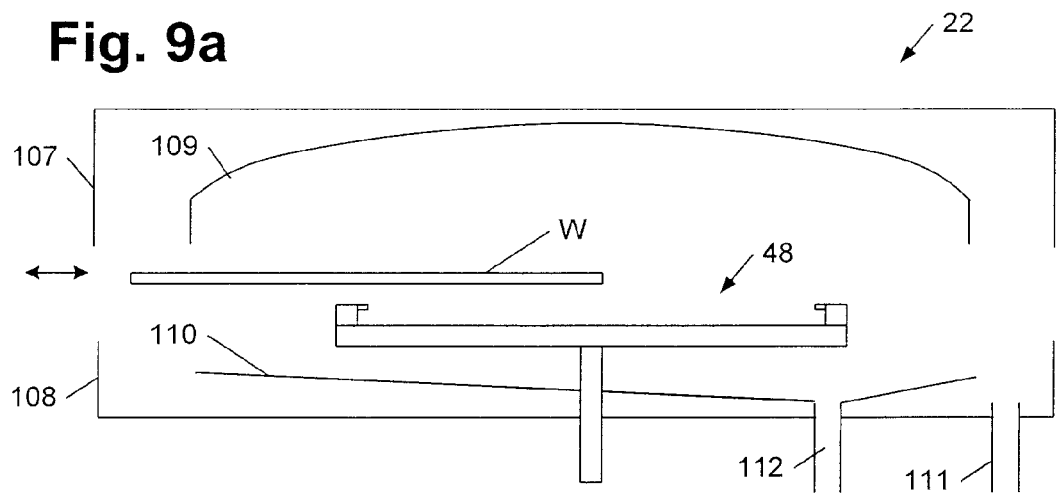
FIG. 9a depicts a partial cross-sectional view of a process chamber in an open position.
Figure 9B:
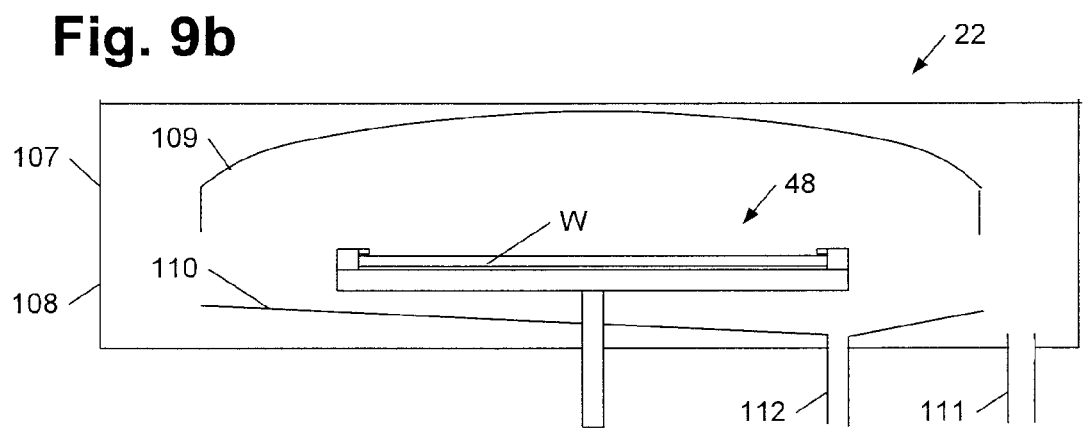
FIG. 9b depicts a partial cross-sectional view of the process chamber of FIG. 9a in which outer portions are coupled to form a first enclosed region.
Figure 9C:
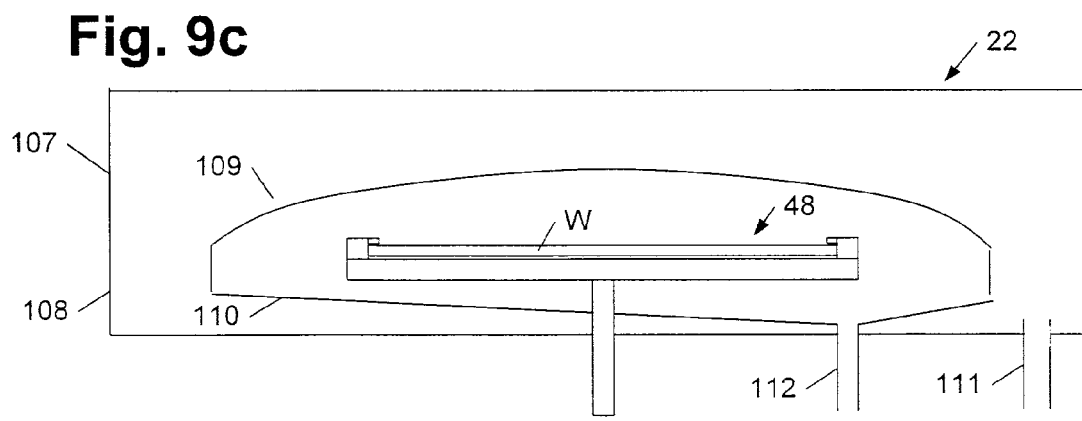
FIG. 9c depicts a partial cross-sectional view of the process chamber of FIG. 9a in which inner portions are coupled to form a second enclosed region.

As shown in FIG. 1, process chamber 22 is generally configured to form a single enclosed area about substrate holder 48 for processing a microelectronic topography. An alternative configuration for process chamber 22, however, may be adapted to form multiple enclosed areas about substrate holder 48. An illustration of such an alternative configuration is illustrated in FIGS. 9a-9c. In particular, FIGS. 9a-9c illustrates process chamber 22 adapted to form two different enclosed areas about a microelectronic topography. As noted above, process chamber 22 may be adapted to perform a succession of different process steps. As such, although process chamber 22 is shown in FIGS. 9a-9c without any of the auxiliary components described in reference to FIG. 1, the process chamber shown in FIGS. 9a-9c may be coupled to such components. In particular, the process chamber 22 illustrated in FIGS. 9a-9c may be coupled to supply lines, exhaust lines, temperature and pressure gauges and controls, storage tanks, and a CPU unit.

Furthermore, the process chamber depicted in FIGS. 9a-9c may include auxiliary equipment attached thereto. In particular, the process chamber shown in FIGS. 9a-9c may, in some embodiments, include a gate arranged along a chamber wall and/or a cover of the chamber. In addition or alternatively, the process chamber illustrated in FIGS. 9a-9c may include a plurality of input ports, such as but not limited to shower element 92 and dispensing arm 94. The exclusion of input ports and a gate within FIGS. 9a-9c is merely to simplify the illustration of the drawings and, therefore, does not necessarily indicate the absence of such components. Substrate holder 48, however, is shown within process chamber 22 in FIGS. 9a-9c to aid in describing the adaptations of the chamber. Such a substrate holder may be substantially similar to the substrate holder depicted in FIG. 1 and, therefore, may include similar components and adaptations of the holder as described above.

In general, process chamber 22 may be adapted to form a first enclosed area about and including substrate holder 48 as well as a second, smaller enclosed area about and including the substrate holder as shown in FIGS. 9b and 9c, respectively. FIG. 9a, on the other hand, illustrates process chamber 22 during the loading of a wafer, prior to the formation of the first and second enclosed regions. In some embodiments, the adaptation of process chamber 22 to form the first and second enclosed regions may include an outer set of portions and an inner set of portions configured to couple with each other and respectively form the first and second enclosed regions. In particular, process chamber 22 may include upper outer portion 107 and lower outer portion 108 configured to form an enclosed region about substrate holder 48. In general, the first enclosed region formed by coupling outer portions 107 and 108 may include everything within the interior of the outer portions, including inner portions 109 and 110. In some embodiments, such a first enclosed region may include the entirety of process chamber 22. In other embodiments, however, process chamber 22 may include one or more casings surrounding outer portions 107 and 108.

In either case, process chamber 22 may further include upper inner portion 109 and lower inner portion 110 configured to form a second enclosed region about substrate holder 48. Such a second enclosed region may solely include the portions of process chamber 22 interior to the inner portions and, therefore, is not as large as the first enclosed region. In this manner, the configuration of process chamber 22 may allow multiple regions to be enclosed during processing of a topography. In some embodiments, outer portions 107 and 108 and inner portions 109 and 110 may include other configurations with which to form the respective enclosed regions within process chamber 22. For example, gate 28 and chamber wall 23 may alternatively serve as outer portions of process chamber 22 with which to form a first enclosed region about substrate holder 48. In addition or alternatively, inner portions 109 and 110 may include a different configuration with which to form the second enclosed region about substrate holder 48. For example, lower inner portion 110 may, in some embodiments, configured in a concave shape. As such, process chamber 22 is not restricted to the references and configurations of outer portions 107 and 108 and inner portions 109 and 110 depicted in FIGS. 9a-9c. Rather, process chamber 22 may generally include outer and inner portions with which to form at least two different enclosed regions about a substrate holder.

In some embodiments, the system comprising process chamber 22 may be adapted to couple outer portions 107 and 108 prior to the succession of the different process steps performed within the process chamber. In addition, the system may be adapted to couple and uncouple inner portions 109 and 110 between the different process steps without uncoupling outer portions 107 and 108. For example, the system may be adapted to couple inner portions 109 and 110 prior to an electroless deposition process and uncouple the inner portions subsequent to the electroless deposition process. The system may be additionally or alternatively adapted to couple inner portions 109 and 110 prior to and subsequent to other processing steps as well, depending on the fabrication parameters of the wafer. In this manner, the system may be adapted to dispense different processing fluids into the first and second enclosed areas during different process steps. In some cases, the system may be additionally or alternatively adapted to uncouple outer portions 107 and 108 for a drying process of the microelectronic topography. In yet other cases, however, the system may be adapted to keep outer portions 107 and 108 closed until all processing steps are completed. In such an embodiment, a drying process may be alternatively conducted by injecting gas through an air nozzle or by opening the process chamber to ambient air by a means other than uncoupling outer portions 107 and 108, such as opening a gate attached to process chamber 22. In yet other embodiments, the drying process may be conducted by discharging fluids within process chamber 22, creating a low-pressure vacuum by which to dry the topography.

As shown in FIGS. 9a-9c, process chamber 22 may include outlet 111 arranged within lower outer portion 108 exterior to lower inner portion 110. In addition, process chamber 22 may include outlet 112 arranged within lower inner portion 110. In some embodiments, process chamber 22 may be adapted to prevent processing fluids in the first enclosed area from entering the outlet 112. For example, in some embodiments, process chamber 22 may include a means for spinning a microelectronic topography arranged upon substrate holder 48. In particular, process chamber 22 may be adapted to rotate a wafer at a fast enough rate to prevent processing fluids from entering outlet 112. In general, such a rate may be between approximately 0 rpm and approximately 8000 rpm or, more specifically, between approximately 40 rpm and approximately 1200 rpm and may be conducted when inner portions 109 and 110 are not coupled together. In contrast, process chamber 22 may or may not spin a microelectronic topography when inner portions 109 and 110 are coupled. Larger or smaller rates of rotation may be used in either case, depending on the design specifications of the system and viscosity of the process fluid as described in more detail below.

In some cases, upper inner portion 109 may also be adapted to rotate. In particular, upper inner portion 109 may be configured to rotate when decoupled from lower inner portion 110. Such an adaptation to rotate may advantageously allow solution residue from one or more processing steps to be removed from the inner surface of upper inner portion 109. In this manner, cross-contamination of fluids used for different processes may be prevented. In general, upper inner portion 109 may be adapted to rotate during any process step used to fabricate a microelectronic device. For example, upper inner portion 109 may be rotated during a rinse and/or a drying cycle of the fabrication process. In any case, the rotation of upper inner portion 109 and the wafer may be conducted simultaneously or may be conducted independent of each other. In addition, system 20 may be adapted to rotate upper inner portion 109 and the wafer in the same direction and/or different directions.

Figure 10:
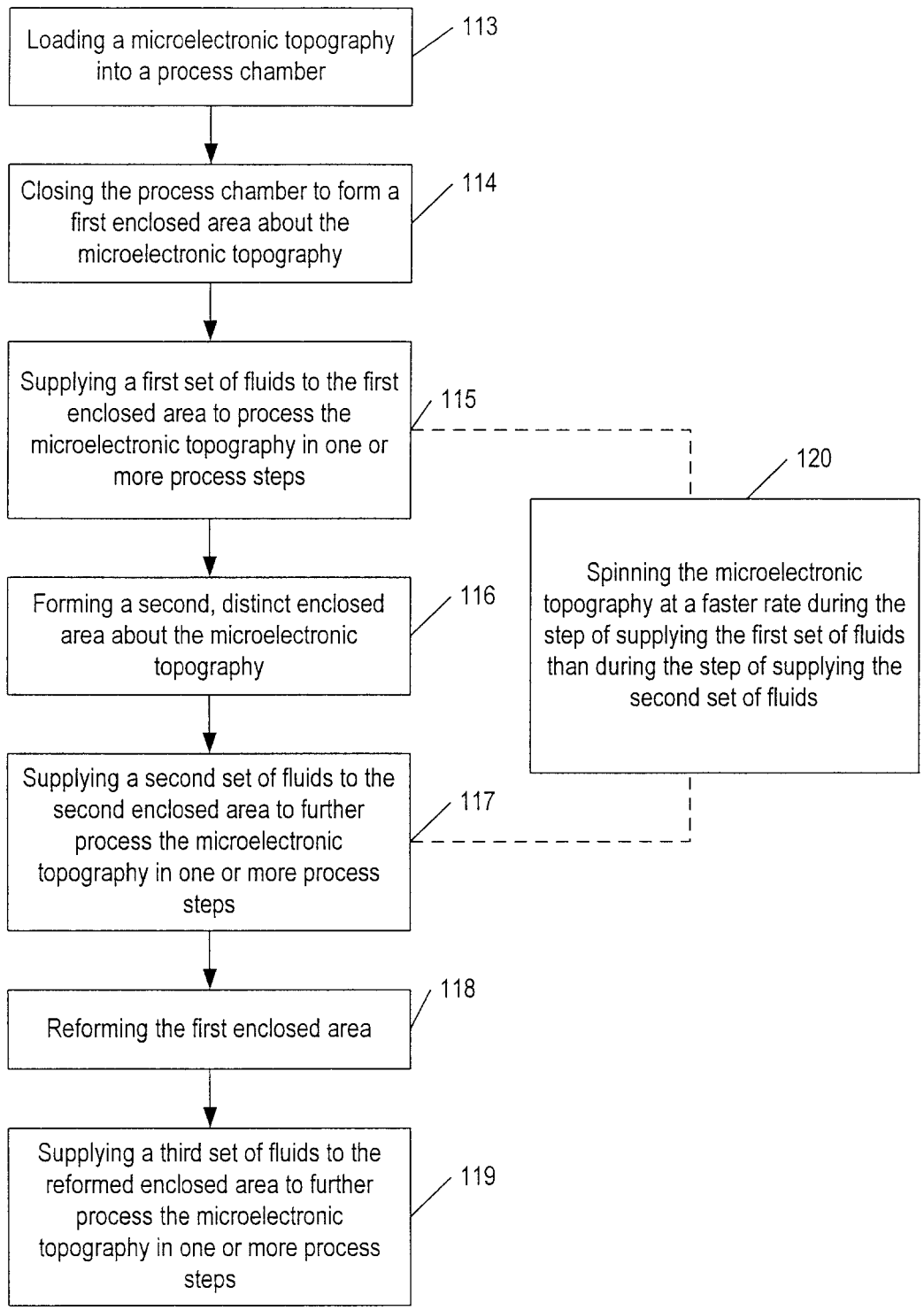
FIG. 10 depicts a flow chart for processing a microelectronic topography using the process chamber of FIGS. 9a-9c.

A method for processing a microelectronic topography using the configuration illustrated in FIGS. 9a-9c is outlined in the flowchart of FIG. 10. The method may include steps 113 in which a microelectronic topography is loaded into a process chamber. Such a loading step may correspond to FIG. 9a of process chamber 22. As shown in FIG. 10, the method may further include step 114 in which the process chamber is closed to form a first enclosed area about the microelectronic topography. FIG. 9b illustrates the formation of such a first enclosed region. The formation of the first enclosed area may, in some embodiments, include moving a cover plate toward a base plate of the process chamber. In yet other embodiments, however, the formation of the first enclosed area may include moving the base plate toward the cover plate or moving the cover plate and base plate toward each other. In either case, the method may further include supplying a first set of fluids to the first enclosed area to process the microelectronic topography in one or more process steps as shown in step 115.

The method may continue to step 116 in which a second, distinct enclosed area is formed about the microelectronic topography subsequent to the step of supplying the first set of fluids. FIG. 9c illustrates the formation of such a second enclosed region. The second enclosed area may be supplied with a second set of fluids to further process the microelectronic topography in one or more other process steps as shown in step 117. In some embodiments, the first set of fluids may include fluids for preparing the microelectronic topography for an electroless deposition process and the second set of fluids may include a deposition solution for the electroless deposition process. In such an embodiment, the method may include reforming the first enclosed area subsequent to the step of supplying the second set of fluids and supplying a third set of fluids to the reformed first enclosed area to process the microelectronic topography subsequent to the electroless deposition process as shown in steps 118 and 119, respectively. Alternatively, the first set of fluids may include a deposition solution for an electroless deposition process, and the second set of fluids may include fluids for processing the microelectronic topography subsequent to the electroless deposition process.

In any case, the method may further include spinning the microelectronic topography as noted in step 120. Such a spinning step may be conducted while the first and/or second set of fluids is supplied to the process chamber. As such, step 120 is shown extending from steps 115 and 117 by a dotted line. In some embodiments, spinning the microelectronic topography may be further conducted during the formation of the first and/or second enclosed areas. In general, the rate at which to spin the topography may depend on the material supplied to the process chamber. In particular, a relatively high spin rate may be needed for fluids with a relatively high viscosity, while a relatively lower spin rate may be needed for fluids with a relatively low viscosity. As such, the spin rate of the topography when the first and second sets of fluids are supplied to the process chamber may be similar or may be substantially different.

In any case, the microelectronic topography may generally be spun at a rate between approximately 0 rpm and approximately 8000 rpm, or more specifically between approximately 40 rpm and approximately 1200 rpm, depending on the viscosity of the fluid supplied to the process chamber. In some embodiments, the topography may be rotated at a sufficient rate to prevent fluids from entering a certain outlet as noted above. In embodiments in which the first and second sets of fluids comprise a similar viscosity, the microelectronic topography may be rotated at a different rate when the first set fluids are supplied to the process chamber than when the second set of fluids are supplied to the process chamber. For example, in some embodiments, the microelectronic topography may be spun at a rate between approximately 0 rpm and approximately 20 rpm when the first set of fluids is supplied to the process chamber. In contrast, the microelectronic topography may be spun at a rate between approximately 40 rpm and approximately 300 rpm when the second set of fluids is supplied to the process chamber or vice versa.

As noted above, methods for processing a microelectronic topography is provided herein. In particular, methods for forming a contact structure or a via within a dielectric layer are described below in reference to FIGS. 11-18. Although the process steps described in reference to FIGS. 11-18 are provided in sequence to each other, the process steps are not necessarily co-dependent. Consequently, the method described in reference to FIGS. 11-18 may be performed independent of each other. In addition, the topographies depicted in FIGS. 11-18 are not drawn to scale. In particular, the dimensions of the layers and structures may vary from tens of angstroms to a few microns. As such, the method described herein is not restricted to forming a device having the relative dimensions of the layers and structures depicted in FIGS. 11-19. In some embodiments, the process steps described in reference to FIGS. 11-18 may be conducted using the system and/or techniques described in reference to FIGS. 1-10. However, the process steps of FIGS. 11-18 are not restricted to the use of such a system. In particular, the process steps described in reference to FIGS. 11-18 may be either conducted within the same chamber or within different chambers.

Figure 11:
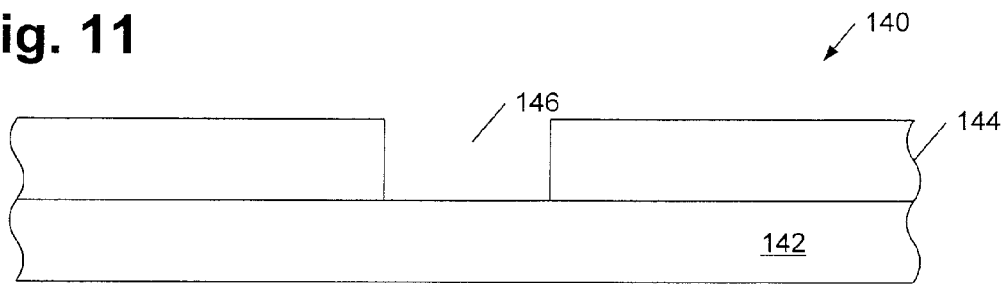
FIG. 11 depicts a partial cross-sectional view of a microelectronic topography having a trench formed within a dielectric layer.

FIG. 11 depicts microelectronic topography 140 having trench 146 formed within dielectric layer 144, which in turn is formed upon underlying layer 142. In general, dielectric layer 144 may be an interlevel dielectric layer and may serve as an insulating layer, etch stop layer, and/or a polishing stop layer. In any case, dielectric layer 144 may have a thickness between approximately 2,000 angstroms and approximately 10,000 angstroms. Larger or smaller thicknesses of dielectric layer 144, however, may be appropriate depending on the semiconductor device being formed. Dielectric layer 144 may include one or more of various dielectric materials used in microelectronic fabrication. For example, dielectric layer 144 may include silicon dioxide ($SiO_2$), tetraethylorthosilicate glass (TEOS) based silicon dioxide, silicon nitride ($Si_xN_y$), silicon dioxide/silicon nitride/silicon dioxide (ONO), silicon carbide, carbon-doped $SiO_2$, or carbonated polymers. Alternatively, dielectric layer 144 may be formed from a low-permittivity ("low-k") dielectric, generally known in the art as a dielectric having a dielectric constant of less than about 3.5. One low-k dielectric in current use, which is believed to make a conformal film, is fluorine-doped silicon dioxide. In some cases, dielectric layer 144 may be undoped. Alternatively, dielectric layer 144 may be doped to form, for example, low doped borophosphorus silicate glass (BPSG), low doped phosphorus silicate glass (PSG), or fluorinated silicate glass (FSG). Low doped BPSG may have a boron concentration of less than approximately 5% by weight. Low doped PSG may have a phosphorus concentration of less than approximately 10% by weight, and more preferably less than approximately 5% by weight.

In some cases, underlying layer 142 may be a silicon substrate and may, in some embodiments, be doped either n-type or p-type. More specifically, underlying layer 142 may be a monocrystalline silicon substrate or an epitaxial silicon layer grown on a monocrystalline silicon substrate. In addition or alternatively, underlying layer 142 may include a silicon on insulator (SOI) layer, which may be formed upon a silicon wafer. In any case, the feature subsequently formed within trench 146 may serve as a contact structure to portions of a silicon substrate in some embodiments. In other cases, however, underlying layer 142 may include metallization and/or an interlevel dielectric of a microelectronic topography. In such an embodiment, the feature subsequently formed within trench 146 may serve as a via to underlying portions of microelectronic topography 140. In yet other embodiments, the feature subsequently formed within trench 146 may serve as an interconnect line or any other metallization feature of the microelctronic topography.

In any case, trench 146 may be formed within dielectric layer 144 by a lithography process known to those skilled in the art of microelectronic fabrication. In particular, a photoresist layer may be patterned upon dielectric layer 144 and exposed portions of dielectric layer 144 may be etched to form trench 146. Subsequent to the etch process, the patterned photoresist layer may be removed by a stripping process such as a wet etch, plasma etch, and/or a reactive ion etch stripping process. Such an etch process may, in some embodiments, be conducted in the same process chamber used to form trench 146. In some cases, the photoresist etch process may be conducted in the same process chamber used to subsequently process semiconductor topography 140. For example, the photoresist etch process may be conducted in the same process chamber used to electrolessly deposit material into trench 146. Although FIG. 11 illustrates the formation of a single trench across the illustrated portion of dielectric layer 144, any number of trenches may be formed across the dielectric layer in accordance with design specifications of the integrated circuit. In addition, although FIG. 11 illustrates trench 146 extending from the upper surface of dielectric layer 144 to the upper surface of underlying layer 142, the method described herein is not restricted to such a configuration of microelectronic topography 140. In particular, the depth of trench 146 may be reduced, in some embodiments, such that underlying layer 142 is not exposed.

In general, the width and depth of trench 146 may be formed in accordance with the design specifications of the integrated circuit. For example, the width of trench 146 may be between approximately 0.02 microns and approximately 10 microns. In addition, the depth of trench 146 may be between approximately 100 angstroms and approximately 1.0 micron. However, larger or smaller widths and depths may be used, depending on the design specifications of the device. In some embodiments, the height (i.e., depth) and width of a semiconductor feature when viewed in cross section may be described in relation to each other and may be referred to as an "aspect ratio" of the feature. Consequently, the depth and width of trench 146 may, in some embodiments, be described in terms of an aspect ratio. In particular, the aspect ratio of trench 146 may between approximately 1:2 and approximately 1:10. However, trench 146 may include larger or smaller aspect ratios, depending on the design specifications of the device.

As noted above, trench 146 may be used to subsequently form a metal feature within microelectronic topography 140. As such, trench 146 may be filled with a metal layer, such as aluminum, copper, tungsten, titanium, silver, or any alloy of such metals. "Metal layer," as used herein, may generally refer to any material comprising metal, including layers consisting essentially of a metal element and layers including alloys or intermetallics of a metal element. The deposition of the metal layer forming the bulk of the metal feature within trench 146 is described in more detail below in reference to FIG. 14. In some cases, however, liner layer 148 may be deposited within trench 146 prior to the deposition of the bulk metal layer. Such a liner layer may serve to adhere the bulk metal layer to trench 146 and/or prevent diffusion between the bulk metal layer and underlying portions of microelectronic topography 140. For example, since copper diffuses readily through silicon and oxide and undesirably alters the electrical properties of transistors formed in silicon, liner layer 148 may be deposited within trench 146 before deposition of a bulk copper layer. Liner layer 148 may be deposited within trench 146 before the deposition of other bulk metal materials as well. In yet other embodiments, the formation of liner layer 148 may be omitted from microelectronic topography 140 and, therefore, the method described herein may continue onto to FIG. 14 from FIG. 11.

Figure 12:
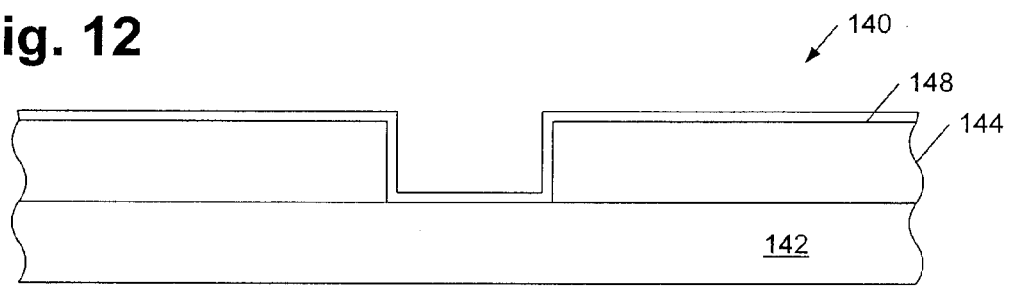
FIG. 12 depicts a partial cross-sectional view of the microelectronic topography of FIG. 11 subsequent to the formation of a liner layer upon the upper surface of the topography.

As shown in FIG. 12, liner layer 148 may be formed conformably upon microelectronic topography 140 and, therefore, may be formed upon the lower surface and sidewalls of trench 146 as well as the upper surfaces of dielectric layer 144. Such a deposition process may include chemical vapor deposition (CVD), physical vapor deposition (PVD), atomic layer deposition (ALD), electroplating, or electroless plating techniques, depending on the material deposited. Consequently, the deposition solution used to deposit liner layer 148 may depend on the material to be deposited and the method of deposition. In any case, microelectronic topography 140 may be rinsed with deionized water subsequent to the deposition of liner layer 148 to remove any residual deposition solution. In general, the thickness of liner layer 148 may between approximately 50 angstroms and approximately 1500 angstroms. Larger or smaller thickness of liner layer 148, however, may be used, depending on the design specifications of the device.

In some cases, liner layer 148 may include a metal material, such as tantalum, tantalum nitride, tantalum silicon nitride, tantalum carbon nitride, silver, titanium, titanium nitride, titanium silicon nitride, titanium silicon nitride, tungsten, tungsten nitride, or refractory alloys such as titanium-tungsten or copper-cadium. In some embodiments, liner layer 148 may include a combination of metal materials, such as a stack of tantalum nitride and tantalum or a stack of titanium and titanium nitride, for example. In some cases, it may be particularly advantageous for liner layer 148 to include a metal such that the capacitance of the feature formed within trench 146 may be minimized. In yet other embodiments, however, liner layer 148 may include a dielectric material, such as silicon nitride, silicon carbide, silicon carbon nitride, silicon oxycarbide, silicon oxycarbon nitride, and/or any organic materials generally known for use in microelectronic fabrication. In any case, liner layer 148 may be hydrated as described in more detail below in reference to FIG. 13. It is noted, however, that liner layer 148 is not restricted to being hydrated and/or the compositions listed above. In general, the materials listed for liner layer 148 and the subsequent processing of liner layer 148 presented herein are merely options available for forming a metal feature within microelectronic topography 140. Such a statement may be applicable to utilizing a four-element liner layer discussed in more detail below as well. In particular, the metal feature and method of forming the feature described herein is not restricted to embodiments in which liner layer 148 includes at least four elements.

As noted above, liner layer 148 may, in some embodiments, include a single material comprising at least four elements. In particular, liner layer 148 may include a single material comprising at least four elements from the group consisting of boron, chromium, cobalt, molybdenum, nickel, phosphorus, rhenium, and tungsten. For example, in some cases, liner layer 148 may include a material comprising cobalt, tungsten, molybdenum and phosphorus. In other cases, liner layer 148 may include a material comprising cobalt, tungsten, molybdenum and boron. In any case, liner layer 148 may be formed as a single material layer such that no interfacial lines between layers of different compositions exist within the layer. In other words, the elements within liner layer 148 may be blended to characterize a layer of single material. Consequently, liner layer 148 may be distinguishable from a metal feature comprising a plurality of liner layers.

A "liner layer," as used herein, may refer a layer conformably formed along at least a portion of the sidewalls and/or lower surface of a trench such that a substantial portion of the trench prior to the deposition of the layer remains unfilled after deposition of the layer. In some embodiments, the liner layer may be formed along the entirety of the sidewalls and lower surface of the trench as shown in FIG. 12. In other embodiments, however, the liner layer may only be partially formed on the sidewalls and/or lower surface of the trench. In such an embodiment, the liner layer may either be selectively deposited or portions of the layer may be removed after a blanket deposition of the layer within the trench. In either case, the liner layer may, in some embodiments, be arranged along portions of the topography adjacent to the trench as shown in FIG. 12. Alternatively, the liner layer may not include the adjacent portions.

In general, liner layer 148 may include any combination of boron, chromium, cobalt, molybdenum, nickel, phosphorus, rhenium, and tungsten, depending on the design characteristics of the device. For example, liner layer 148 may include a combination of elements which is configured to adhere a bulk metal layer used to subsequently fill trench 146. In addition or alternatively, liner layer 148 may include a combination of elements which is configured to substantially prevent diffusion between underlying layers of microelectronic topography 140 and the bulk metal layer subsequently formed upon the liner layer. In such an embodiment, including molybdenum within liner layer 148 may be particularly advantageous since molybdenum exhibits superior diffusion barrier properties and has a high melting point. In any case, liner layer 148 may, in some embodiments, include a combination of elements which is less susceptible to oxidation than a liner layer comprising a material with three or less elements. For example, liner layer 148 may include products of oxidizing reducing agents, such as boron or phosphorus.

In some cases, liner layer 148 may include a combination of elements which is configured to serve as a catalyst for a subsequent electroless deposition of a bulk metal layer within trench 146. For example, liner layer 148 may include a combination of elements which is configured to serve as a catalyst for a subsequent electroless deposition of copper or any other metal used to occupy a substantial portion of trench 146. In such an embodiment, liner layer 148 may preferably include and/or nickel for their ability to form an autocatalytic surface. "Autocatalytic," as used herein, may refer to the characteristic of a material to have electrochemical properties which exhibit an affinity to the material to be deposited thereon. Consequently, an "autocatalytic" material may not have to be activated prior to an electroless deposition process since the material is already catalytic to the process. In some embodiments, however, an autocatalytic material may be activated prior to an electroless deposition process.

In some cases, liner layer 148 may include a majority of cobalt and/or nickel atoms. For example, liner layer 148 may include two or three elements other than cobalt or nickel which each comprise between approximately 0.1% and approximately 20% of a molar concentration of the liner layer. In particular, liner layer 148 may include one or two elements having a molar concentration between approximately 0.1% and approximately 20% which are selected from the group consisting of chromium, molybdenum, rhenium, and tungsten. In addition, liner layer 148 may include between approximately 0.1% and approximately 20% of phosphorous and/or boron. The remaining balance of the molar concentration of the layer may include cobalt and/or nickel.

Figure 13:
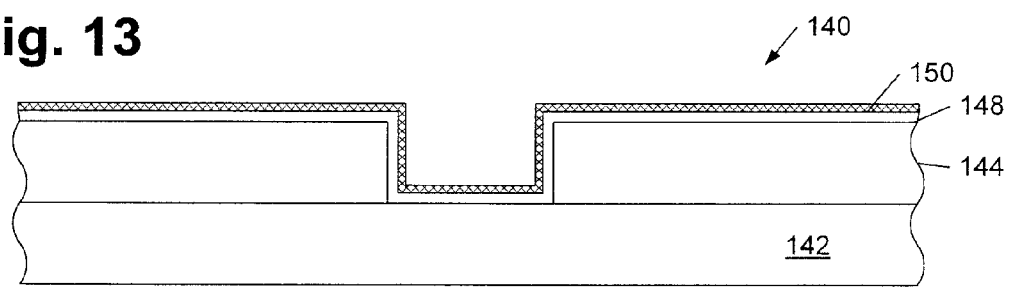
FIG. 13 depicts a partial cross-sectional view of the microelectronic topography of in which an upper portion of the liner layer is hydrated subsequent to the formation of the liner layer.

Regardless of number of elements included within liner layer 148, the method may further include hydrating microelectronic topography 140, in some cases. In particular, microelectronic topography 140 may be exposed to a hydrolysis process subsequent to the deposition of liner layer 148 such that hydrated layer 150 may be formed as shown in FIG. 13. For example, in embodiments in which liner layer 148 includes tantalum, tantalic acid ($H_2xTa_2O_{5+x}$) may be formed. In yet other embodiments, liner layer 148 may include tantalum nitride, tantalum silicon nitride, tantalum carbon nitride, titanium, titanium nitride, titanium silicon nitride, tungsten, tungsten nitride, or refractory alloys such as titanium-tungsten with which to form a hydrated metal oxide layer. As noted above, the liner layer 148 may, in some embodiments, include a combination of such materials, such as a stack of tantalum nitride and tantalum or a stack of titanium and titanium nitride, for example. In such an embodiment, a hydrated metal oxide layer may be formed solely from the upper material of the stack or may be formed from more than one material within the stack. In yet other embodiments, liner layer 148 may include a dielectric material rather than a metal layer. For example, liner layer 148 may include silicon nitride, silicon carbide, silicon carbon nitride, silicon oxycarbide, and/or silicon oxycarbon nitride. In such an embodiment, liner layer 148 may be hydrated to form a hydrated oxide material without a metal component.

In any case, the hydrolysis process may include oxidizing liner layer 148. As such, the hydrolysis process may include exposing liner layer 148 to an oxidizing plasma, in some embodiments. In addition or alternatively, the hydrolysis process may include exposing liner layer 148 to an oxidizing chemical, such as peroxide, in a liquid or gaseous state. In yet other embodiments, the hydrolysis process may include exposing the liner layer to ultraviolet photons in an oxidizing ambient. In such a case, the ultraviolet photons may be used to alter the molecular structure of the liner layer such that elements of the liner layer may be oxidized. In any embodiment, the hydrolysis process may further include exposing liner layer 148 to a chemical comprising hydrogen, including any acid, base or neutral chemical including hydrogen. For example, the hydrolysis process may further include exposing liner layer 148 to sulfuric acid, hydrochloric acid, nitric acid, ammonia hydroxide, potassium hydroxide, or deionized water.

In general, the hydrolysis process used to form hydrated layer 150 may either partially or completely consume liner layer 148. In some embodiments, the hydration of liner layer 148 may consume an upper portion of the layer having a thickness between approximately 5 angstroms and approximately 40 angstroms. As such, the thickness of liner layer 148 may be reduced by such an amount during the hydrolysis process. In some cases, the hydrolysis process may cause a growth upon liner layer 148 in addition to consuming liner layer 148. In such an embodiment, the composite thickness of liner layer 148 and hydrated layer 150 may be larger than the thickness of liner layer 148 prior to the hydrolysis process. In particular, the composite thickness of liner layer 148 and hydrated layer 150 may include a thickness between approximately 50 angstroms and approximately 1600 angstroms. More specifically, hydrated layer 150 may include a thickness between approximately 5 angstroms and approximately 50 angstroms. As noted above, not all process steps described herein need to be included in the process of forming a metal feature within trench 146. As such, in some embodiments, the hydrolysis of liner layer 148 may be omitted. In either case, the process of forming a metal feature within trench 146 may include cleaning liner layer 148 prior to the deposition of bulk metal layer 152. In particular, surface contaminants and/or oxides formed upon liner layer 148 may be removed prior to the formation of hydrated layer 150 or directly prior to the deposition of bulk metal layer 152.

In general, hydrating liner layer 148 may be particularly advantageous when the bulk metal layer for the subsequently formed metal feature is deposited using an electroless deposition process. In particular, hydrated layer 150 may serve to adsorb active catalytic metals subsequently deposited upon microelectronic topography 140 such that a bulk metal layer may be electrolessly deposited. More specifically, hydrated layer 150 may allow more active catalytic metals to be adsorbed as compared to a layer which has not been hydrated. Consequently, the subsequent electroless deposition of bulk metal may be faster, more uniform, and adhere more securely to trench 146. In some embodiments, hydrated layer 150 may be autocatalytic and, therefore, may not have to be activated to initiate the electroless deposition process. In other embodiments, however, hydrated layer 150 may have to be activated prior to electrolessly depositing bulk metal layer 152. Such an activation process may also be conducted when liner layer 148 is not hydrated. In either case, the activation process may include depositing a monolayer of cobalt, nickel, palladium, or platinum such that a seed layer of the material may be formed. In such an embodiment, the seed layer may be patterned to be in alignment with trench 146 prior to the deposition of bulk metal layer 152.

In yet other embodiments, however, the bulk metal layer subsequently deposited within trench 146 may not be electrolessly deposited. Rather, the bulk metal layer may be deposited using CVD, PVD, ALD, or electroplating techniques, depending on the type of material being deposited. In such an embodiment, liner layer 148 and/or hydrated layer 150 may not have to be activated. In some cases, liner layer 148 and/or bulk metal layer 152 may be deposited as oxidized materials and later converted into conductive metals by annealing the layers in a reducing ambient. In any case, microelectronic topography 140 may be rinsed with deionized water prior to the deposition of bulk metal layer 152. More specifically, microelectronic topography 140 may be rinsed subsequent to the formation of hydrated layer 150 and/or subsequent to the deposition of the activation seed layer to remove any residual deposition solutions. In general, bulk metal layer 152 may include a conductive material, such as aluminum, cadmium, copper, tungsten, titanium, silver, or any alloy of such metals. In this manner, the feature formed within trench 146 may be used to electrically transmit signals within the device formed therefrom.

Figure 14:
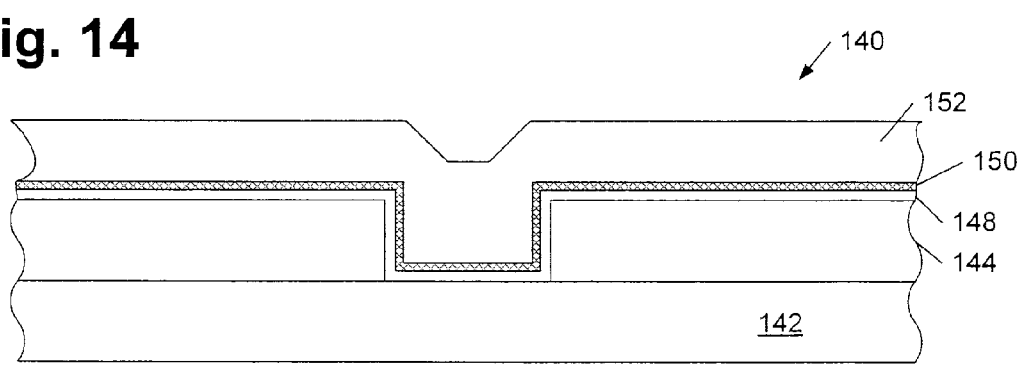
FIG. 14 depicts a partial cross-sectional view of the microelectronic topography in which a bulk metal layer is formed upon the hydrated surface of the liner layer subsequent to the formation of the hydrated surface in FIG. 13.

As shown in FIG. 14, bulk metal layer 152 may be deposited within trench 146. In particular, bulk metal layer 152 may, in some embodiments, be formed conformably over microelectronic topography 140 such that the bulk metal layer is formed outside of trench 146 as well as inside the trench. In yet other embodiments, however, bulk metal layer 152 may be selectively deposited within trench 146. Such a selective process may include electrolessly depositing a bulk metal layer upon a liner layer which is catalytic to the electroless deposition process. For example, bulk metal layer 152 may be selectively deposited upon a liner layer comprising at least four elements as described above in reference to FIG. 12. In such an embodiment, portions of the liner layer formed upon the upper surfaces of dielectric layer 144 may be removed prior to the electroless deposition of the bulk metal layer. In this manner, the bulk metal layer may not be deposited upon portions of microelectronic topography 140 arranged adjacent to trench 146. In such an embodiment, the bulk metal layer may be formed to a particular level within trench 146. For example, bulk metal layer 152 may be formed to be substantially coplanar with the upper surfaces of dielectric layer 144 or just slightly below the upper surfaces of dielectric layer 144 such that room within trench 146 remains for the deposition of a cap layer upon bulk metal layer 152.

In yet other cases, bulk metal layer 152 may be deposited to a level above the upper surfaces of dielectric layer 144. In particular, bulk metal layer 152 may be deposited to a thickness between 0.5 microns and approximately 1.5 microns such that trench 146 is filled. Such a configuration may be particularly advantageous in an embodiment in which bulk metal layer 152 is conformably formed across microelectronic topography 140 as shown in FIG. 14. In such an embodiment, portions of bulk metal layer 152 deposited outside of trench 146 may be removed such that the metal feature within trench 146 may be substantially planar with the upper surfaces of dielectric layer 144. Such a removal process may include chemical mechanical polishing microelectronic topography 140 or exposing the topography to an etch back process. In either case, portions of liner layer 148 and hydrated layer 150 deposited outside of trench 146 may also be removed as shown in FIG. 14. Alternatively, portions of liner layer 148 and, in some embodiments, portions of hydrated layer 150 arranged on the upper surfaces of dielectric layer 144 may remain after the removal process such that bulk metal layer 152 is substantially coplanar with either liner layer 148 or hydrated layer 150. In any case, microelectronic topography 140 may be rinsed with deionized water subsequent to the deposition of bulk metal layer 152 to remove any residual deposition solution.

Figure 15:
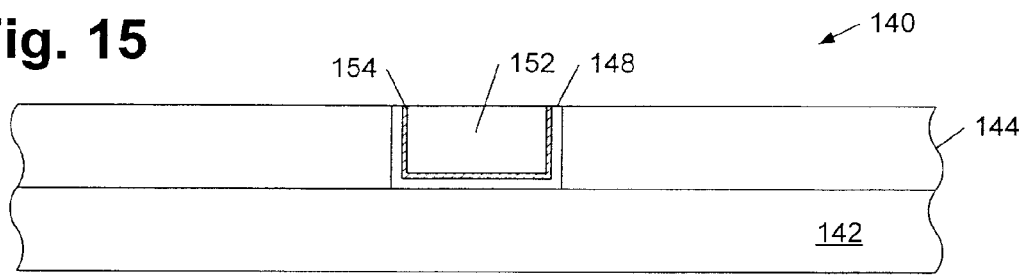
FIG. 15 depicts a partial cross-sectional view of the microelectronic topography in which the bulk metal layer is planarized subsequent to the formation of the bulk metal layer in FIG. 14.

In any case, microelectronic topography 140 may, in some embodiments, be annealed subsequent to the formation of bulk metal layer 152 within trench 146. Such an anneal process may include subjecting microelectronic topography 140 to a temperature greater than approximately 400° C. In some cases, the anneal process may enhance the adhesion of bulk metal layer 152 within trench 146. In addition or alternatively, the anneal process may include dehydrating hydrated layer 150 to form oxide layer 154 between bulk metal layer 152 and liner layer 148, as shown in FIG. 15. For example, in an embodiment in which hydrated layer 150 includes tantalic acid, a layer of tantalum pentoxide may be formed between bulk metal layer 152 and liner layer 148. It is noted that other oxide layers may alternatively be formed within microelectronic topography 140, depending on the composition of hydrated layer 150. In some embodiments, it may be particularly advantageous to form an oxide layer with metal such that the capacitance of the metal feature formed within trench 146 may be minimized. Consequently, the process of hydrating liner layer 148 and dehydrating hydrated layer 150 may be particularly advantageous when liner layer 148 includes a metal. In yet other embodiments, an oxide layer may not be formed within trench 146. In particular, in embodiments in which hydrated layer 150 is not formed within the topography, an oxide layer may not be formed within the metal feature during the subsequent anneal process. In yet other embodiments, the method for forming the metal feature as described herein may not include an anneal process.

In some embodiments, it may be desirable to deposit a cap layer upon the metal feature formed within trench 146. Such a cap layer may serve to prevent diffusion between the metal feature and overlying layers. In addition or alternatively, the cap layer may serve to protect the metal feature during subsequent processing. For example, the cap layer may serve as a polishing stop layer or an etch stop layer such that the metal feature is not exposed or damaged. As such, the method described herein may include the formation of a cap layer upon the metal feature formed within trench 146. In some cases, the formation of the cap layer may follow the sequence of steps described below in reference to FIGS. 16-18. The method described herein, however, is not restricted to such a sequence of process steps. In particular, the method may alternatively include forming the cap layer upon the metal feature within trench 146 without a deposition of a hydrophobic material upon adjacent portions of dielectric layer 144 as described below in reference to FIG. 16. In this manner, dielectric layer 144 may remain exposed prior to the deposition of the cap layer.

Figure 16:
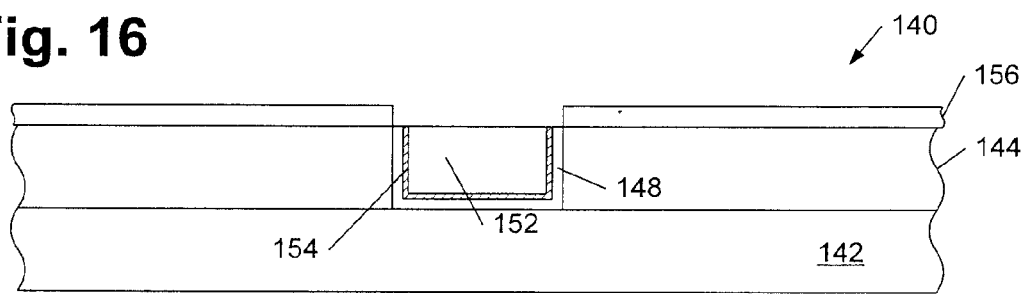
FIG. 16 depicts a partial cross-sectional view of the microelectronic topography in which a hydrophobic dielectric layer is formed upon the dielectric layer subsequent to the planarization of the bulk metal layer in FIG. 15.

Referring to FIG. 16, in some embodiments, hydrophobic dielectric 156 may be selectively deposited upon exposed surfaces of dielectric layer 144. In this manner, dielectric layer 144 may be masked for the subsequent deposition of cap layer 158. In some embodiments, it may be desirable to mask dielectric layer 144 for the deposition of cap layer 158. In particular, hydrophobic dielectric 156 may serve to prevent the deposition of cap layer 158 upon dielectric layer 144.

More specifically, a hydrophobic surface may advantageously prevent the absorption of catalytic compounds, inhibiting the electroless deposition of materials upon hydrophobic dielectric 156, as described in more detail below. In embodiments in which bulk metal layer 152 is polished to be confined within the sidewalls of trench 146 (as described in reference to FIG. 15), dielectric layer 144 may include small fragments of bulk metal layer 152 upon its upper surface. The small fragments may be catalytic to the electroless deposition of cap layer 158 or may attract a catalytic seed layer used to electrolessly deposit cap layer 158. In either case, portions of cap layer 158 may be undesirably deposited upon dielectric layer 144, potentially causing a short within the circuit.

In some cases, dielectric layer 144 may be cleaned prior to the deposition of cap layer 158 to remove the small fragments of bulk metal layer 152 formed within dielectric layer 144. In some embodiments, however, it may be difficult to determine if all fragments have been removed from such a process. As such, in some cases, the formation of a hydrophobic layer upon dielectric layer 144 may be more effective in preventing the undesirable deposition of cap layer 158 on dielectric layer 144. Although the deposition of hydrophobic dielectric 156 may negate the need to remove the bulk metal fragments from dielectric layer 144, the method described herein does not necessarily restrict the inclusion of such a cleaning step when a hydrophobic layer is to be deposited upon dielectric layer 144. As such, cleaning dielectric layer 144 may be performed whether or not a hydrophobic layer is formed within microelectronic topography 140.

In general, hydrophobic dielectric 156 may include various forms of halogenated silanes and/or polymeric silanes. The polymeric silane materials may be polymeric functional groups or may be a polymer with polymeric silane functional groups. Use of either type of polymeric silane material may be particularly useful for sealing a porous surface of a low-k dielectric layer. More specifically, polymeric silane materials may be advantageous for preventing moisture and components of an electroless deposition solution into a low-k dielectric material, which may sometimes be used for dielectric layer 144. The selective deposition of hydrophobic dielectric 156 upon dielectric layer 144 may include, for example, organic vapor phase deposition of any silane material configured to deposit a dielectric material in a halogenated or polymeric form. For example, the selective deposition of hydrophobic dielectric 156 may include the organic vapor phase deposition of dichlorodimethylsilane or dichloromethylsilane. Other silane material that may be additionally or alternatively used for the deposition of hydrophobic dielectric 156 may include methyldichlorosilane, methyltrichlorosilane, trimethylchlorosilane, ethyldichlorosilane, ethyltrichlorosilane, methylethylchlorosilane, methyethyldichlorosilane, propyldichlorosilane, chloropropylmethyldichlorosilane, chloropropyltrichlorosilane, vinyltrichlorosilane, vinylmethyldichlorosilane, phenyltrichlorosilane, diphenyldichlorosilane, phenylmethyldichlorosilane, phenylethyldichlorosilane, trichlorosilane, polyalkenedichlorosilane, polymethylenedichlorosiolane (TBD), and polyethylenedichlorosilane.

In any case, the selective deposition of hydrophobic dielectric layer 156 may also include exposing the substrate to deionized water. In particular, exposing microelectronic topography 140 to deionized water during or after the deposition of hydrophobic dielectric 156 may serve to hydrolize the silane material absorbed within dielectric layer 144 and remove any hydrochloric acid such that a strong bond between hydrophobic 156 and dielectric layer 144 may be formed. In general, the thickness of hydrophobic dielectric 156 may be between approximately 5 angstroms and approximately 500 angstroms. However, larger or smaller thicknesses of hydrophobic dielectric 156 may be deposited, depending on the design specifications of the device. For example, in some embodiments, it may be advantageous to deposit hydrophobic dielectric 156 to a thickness less than approximately 500 angstroms such that the step height of cap layer 158 above dielectric layer 144 is minimized.

As noted above, the deposition of hydrophobic dielectric 156 may be advantageous for preventing the deposition of cap layer 158 upon portions of microelectronic topography 140 other than above trench 146, particularly in embodiments in which cap layer 158 is electrolessly deposited. More specifically, since layer 156 is a dielectric material, it will not be catalytic to the deposition of cap layer 158. In addition, layer 156 may prohibit solution adsorption onto the layer since it is hydrophobic. In general, hydrophilic materials, such as those used for dielectric layer 144, may be susceptible to adsorbing catalytic ions from an activation solution, particularly solutions including palladium ions. As a result, a material subsequently deposited upon microelectronic topography 140 using electroless deposition techniques may be formed upon dielectric layer 144 as well as above trench 146. Since layer 156 is hydrophobic, however, the deposition of cap layer upon portions of microelectronic topography 140 other than above the metal feature within trench 146 may be avoided.

Figure 17:
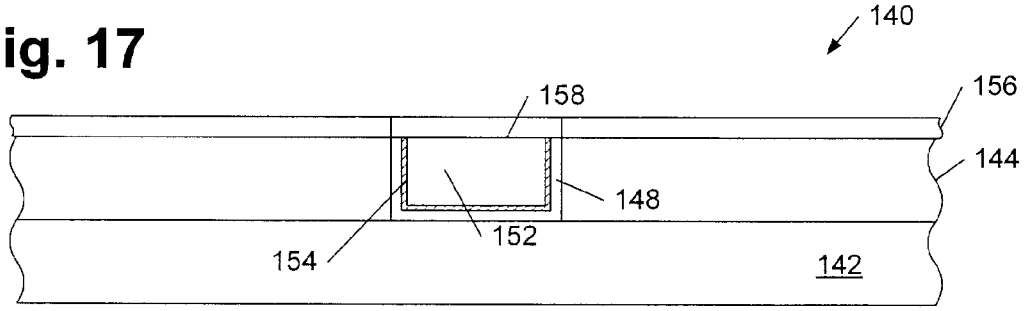
FIG. 17 depicts a partial cross-sectional view of the microelectronic topography in which a cap layer is formed upon the bulk metal layer subsequent to the formation of the hydrophobic dielectric layer in FIG. 16.

In general, cap layer 158 may be deposited upon microelectronic topography 140 as shown in FIG. 17. As noted above, in some embodiments, cap layer 158 may be electrolessly deposited upon microelectronic topography 140 and, therefore, may be selectively deposited upon the metal feature within trench 146. In some embodiments, bulk metal layer 152 may be catalytic to the deposition of cap layer 158 and, therefore, the deposition of a catalytic seed layer upon the bulk metal layer may not be needed. However, in some embodiments, bulk metal layer 152 may be a slow catalyst to the electroless deposition of cap layer 158, undesirably limiting the deposition rate of cap layer 158. For example, a bulk metal layer of copper may be a slow catalyst to the electroless deposition of a cap layer of cobalt, tungsten, and phosphorus. In yet other embodiments, bulk metal layer 152 may not be catalytic to the deposition of cap layer 158 at all.

As such, in some embodiments, a catalytic seed layer may be deposited upon microelectronic topography 140 prior to the deposition of cap layer 158 to enable and/or enhance the selective electroless deposition of the cap layer upon the metal feature within trench 146. In particular, a monolayer of cobalt, nickel, palladium, or platinum may be deposited upon microelectronic topography 140 and subsequently patterned to be in alignment with the metal feature within trench 146 prior to the deposition of cap layer 158. In such an embodiment, microelectronic topography 140 may, in some cases, be rinsed in order to remove any deposition residue of the seed layer prior to the deposition of cap layer 158. In yet other embodiments, cap layer 158 may be conformably deposited across microelectronic topography 140 and patterned to align with the metal feature in trench 146. As such, cap layer 158 may be deposited by processes other than electroless deposition techniques. In particular, cap layer 158 may be deposited by CVD, PVD, ALD, or electroplating techniques. In general, cap layer 158 may be formed to a thickness between approximately 5 angstroms and approximately 50 angstroms. Larger or smaller thicknesses of cap layer 158 may be deposited, however, depending on the design specifications of the device. In any case, microelectronic topography 140 may be cleaned and/or rinsed subsequent to the deposition of cap layer 158 to remove any deposition residue that may have been sparsely formed upon hydrophobic dielectric 156.

In general, cap layer 158 may include one or more elements which are configured to substantially prevent diffusion between bulk metal layer 152 and subsequently formed overlying layers of microelectronic topography 140. For example, cap layer 158 may include a metal material, such as tantalum, tantalum nitride, tantalum silicon nitride, tantalum carbon nitride, titanium, titanium nitride, titanium silicon nitride, tungsten, tungsten nitride, or refractory alloys such as titanium-tungsten. In some embodiments, cap layer 158 may include a combination of such materials, such as a stack of tantalum nitride and tantalum or a stack of titanium and titanium nitride, for example. In yet other embodiments, cap layer 158 may include any combination of boron, chromium, cobalt, molybdenum, nickel, phosphorus, rhenium, and tungsten, depending on the design characteristics of the device. In particular, cap layer 158 may include a single material comprising at least four of such elements as described above in reference to FIG. 12. In yet other embodiments cap layer 158 may include two or three of such elements. For instance, cap layer 158 may include cobalt, tungsten and phosphorus. Other combinations of the aforementioned elements may be possible, depending on the design characteristics of the device.

As shown in FIG. 17, a microelectronic topography may be formed which includes a metal feature having cap layer 158 formed upon and in contact with bulk metal layer 152. In addition, the microelectronic topography may include a dielectric portion including a lower surface substantially coplanar with a lower surface of the metal feature and having a lower layer of hydrophilic material and an upper layer of hydrophobic material. As noted above, dielectric layer 144 may include a dielectric material such as silicon dioxide, silicon nitride, or silicon oxynitride. All such materials are hydrophilic materials, so the dielectric portion of the aforementioned microelectronic topography may refer to hydrophobic dielectric 156 formed upon and in contact with dielectric layer 144.

Figure 18:
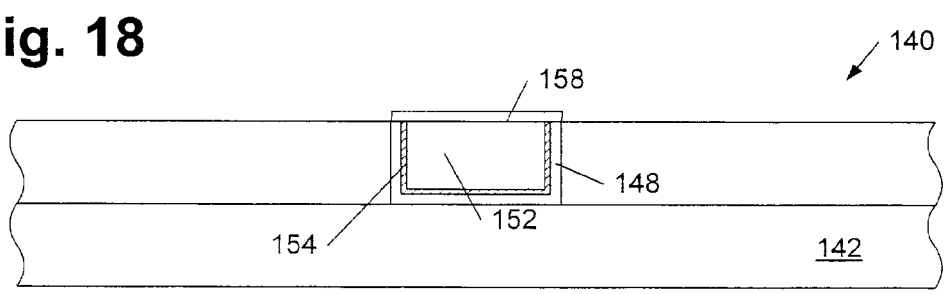
FIG. 18 depicts a partial cross-sectional view of the microelectronic topography in which the hydrophobic layer is removed subsequent to the formation of the cap layer in FIG. 17.

As shown in FIG. 18, hydrophobic dielectric 156 may be removed subsequent to the deposition of cap layer 158, in some embodiments. Such a removal process may include wet or dry etching techniques, such as processes using solvent-based fluids and/or dissolved ozone water, supercritical cleaning techniques, ultraviolet ablation, and/or plasma etching. In some embodiments, only the hydrophobic surface layer of hydrophobic dielectric 156 may be removed by such a process. In yet other embodiments, however, hydrophobic dielectric 156 may not be removed at all. In particular, hydrophobic dielectric 156 may remain within microelectronic topography 140 for subsequent processing. For example, hydrophobic layer 156 may be used to adhere a subsequently deposited layer. In addition or alternatively, hydrophobic layer 156 may be used as an etch stop layer. In such an embodiment, some of the hydrogen atoms within hydrophobic layer 156 may be replaced with amino groups to produce a material with a higher etch selectivity.

In some cases, microelectronic topography 140 may be further processed to form additional layers and structures above the contact structure formed within trench 146. For example, in some embodiments, microelectronic topography 140 may be exposed to processes which form dielectric and/or conductive features upon the contact structure. In some embodiments, an additional layer may be formed upon cap layer 158 to improve the adhesion of the cap layer to subsequently formed overlying layers and structures. In some cases, the additional layer may additionally or alternatively serve as a diffusion barrier for the contact structure. In yet other embodiments, the additional layer may serve as an etch stop layer. In such an embodiment, the additional layer may be blanketed deposited across microelectronic topography 140 such that the additional layer resides upon portions adjacent to cap layer 158 as well as cap layer 158. In any case, the additional layer may include siloxanes, amino-compounds, hetero-atomic organic compounds, or inorganic compounds, for example.

It will be appreciated to those skilled in the art having the benefit of this disclosure that this invention is believed to provide a system and methods for processing a microelectronic topography. Further modifications and alternative embodiments of various aspects of the invention will be apparent to those skilled in the art in view of this description. For example, although the process chamber and methods provided herein are frequently described in reference to process steps conducted prior to, during, and subsequent to an electroless deposition process, the system and methods are not necessarily restricted to such processes. Accordingly, this description is to be construed as illustrative only and is for the purpose of teaching those skilled in the art the general manner of carrying out the invention. It is to be understood that the forms of the invention shown and described herein are to be taken as the presently preferred embodiments. Elements and materials may be substituted for those illustrated and described herein, parts and processes may be reversed, and certain features of the invention may be utilized independently, all as would be apparent to one skilled in the art after having the benefit of this description of the invention. Changes may be made in the elements described herein without departing from the spirit and scope of the invention as described in the following claims.

What is claimed is:

1. A method for processing a microelectronic topography, comprising:
    forming a first metal layer upon the microelectronic topography;
    hydrating at least a portion of the first metal layer to form a hydrated metal oxide layer;
    depositing a second metal layer upon the hydrated metal oxide layer; and
    dehydrating the hydrated metal oxide layer subsequent to the step of depositing the second metal layer.

2. The method of claim 1, wherein the step of hydrating at least a portion of the first metal layer comprises exposing the first metal layer to an oxidizing plasma.

3. The method of claim 1, wherein the step of hydrating at least a portion of the first metal layer comprises exposing the first metal layer to an oxidizing fluid.

4. The method of claim 1, wherein the step of hydrating at least a portion of the first metal layer comprises exposing the first metal layer to irradiating photons.

5. The method of claim 1, wherein the first metal layer comprises tantalum and the hydrated metal oxide layer comprises tantalic acid.

6. The method of claim 5, wherein the step of dehydrating the hydrated metal oxide layer forms tantalum pentoxide beneath the second metal layer.

7. The method of claim 1, wherein the step of forming the first metal layer comprises forming a metal layer selected from a group consisting of tantalum, tantalum nitride, tantalum silicon nitride, tantalum carbon nitride, titanium, titanium nitride, titanium silicon nitride, tungsten and tungsten nitride.

8. The method of claim 1, wherein the step of dehydrating the hydrated metal oxide layer comprises heating the microelectronic topography to a temperature greater than approximately 400° C.

9. The method of claim 1, wherein the step of forming the first metal layer comprises conformably depositing the first metal layer within a trench of the microelectronic topography.

10. The method of claim 1, wherein the step of forming the first metal layer comprises depositing a metal layer substantially absent of boron and phosphorus.

11. The method of claim 1, wherein the step of forming the first metal layer comprises depositing a metal layer comprising cobalt and/or nickel.

12. The method of claim 1, wherein the step of hydrating at least a portion of the first metal layer consumes less than all of the first metal layer prior to the step of depositing the second metal layer upon the hydrated metal oxide layer.

13. The method of claim 1, wherein the step of hydrating at least a portion of the first metal layer consumes all of the first metal layer.

14. The method of claim 1, wherein the step of hydrating at least a portion of the first metal layer limits the hydrated metal oxide layer to a thickness between approximately 5 angstroms and approximately 50 angstroms.

15. The method of claim 1, wherein the step of depositing the second metal layer upon the hydrated metal oxide layer comprises electrolessly plating the second metal layer upon the hydrated metal oxide layer.

16. The method of claim 15, further comprising forming an activation seed layer upon the hydrated metal oxide layer prior to electrolessly plating the second metal layer upon the hydrated metal oxide layer.

\* \* \* \* \*